United States Patent
Naito et al.

(10) Patent No.: US 10,304,845 B2
(45) Date of Patent: May 28, 2019

(54) SEMICONDUCTOR DEVICE AND METHOD OF MANUFACTURING THE SAME

(71) Applicant: Toshiba Memory Corporation, Minato-ku (JP)

(72) Inventors: Hiroaki Naito, Yokkaichi (JP); Satoshi Nagashima, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 303 days.

(21) Appl. No.: 14/642,129

(22) Filed: Mar. 9, 2015

(65) Prior Publication Data

US 2016/0141297 A1  May 19, 2016

Related U.S. Application Data

(60) Provisional application No. 62/079,305, filed on Nov. 13, 2014.

(51) Int. Cl.
*H01L 27/11519* (2017.01)
*H01L 27/11548* (2017.01)
*H01L 21/033* (2006.01)
*H01L 21/3213* (2006.01)

(52) U.S. Cl.
CPC .... *H01L 27/11548* (2013.01); *H01L 21/0337* (2013.01); *H01L 21/32139* (2013.01); *H01L 27/11519* (2013.01)

(58) Field of Classification Search
None
See application file for complete search history.

(56) References Cited

U.S. PATENT DOCUMENTS

| 8,502,322 | B2 | 8/2013 | Nitta |
| 8,785,327 | B2 | 7/2014 | Kikutani |
| 2012/0241834 | A1* | 9/2012 | Nakajima ........... H01L 21/0337 257/316 |
| 2013/0237051 | A1 | 9/2013 | Kikutani et al. |
| 2015/0021790 | A1* | 1/2015 | Nagashima ......... H01L 23/5386 257/775 |

FOREIGN PATENT DOCUMENTS

| JP | 2011-199186 | 10/2011 |
| JP | 2013-135202 | 7/2013 |
| JP | 2013-143398 | 7/2013 |

* cited by examiner

*Primary Examiner* — Shaun M Campbell
*Assistant Examiner* — Aneta B Cieslewicz
(74) *Attorney, Agent, or Firm* — Oblon, McClelland, Maier & Neustadt, L.L.P.

(57) ABSTRACT

In one embodiment, a semiconductor device includes a substrate, and first to fourth interconnects provided on the substrate to be adjacent to one another. The device includes a first pad portion connected with the first or second interconnect, and a second pad portion adjacent to the first pad portion in a first direction. The device includes a third pad portion connected with the third or fourth interconnect, and adjacent to one of the first and second pad portions in a second direction, and a fourth pad portion adjacent to the third pad portion in the first direction, and adjacent to the other of the first and second pad portions in the second direction. The device includes one or more interconnects insulated from the first to fourth interconnects and the first to fourth pad portions, and provided between the first and second interconnects and the third and fourth interconnects.

9 Claims, 20 Drawing Sheets

US 10,304,845 B2

SEMICONDUCTOR DEVICE AND METHOD OF MANUFACTURING THE SAME

CROSS REFERENCE TO RELATED APPLICATION

This application is based upon and claims the benefit of priority from the prior U.S. Provisional Patent Application No. 62/079,305 filed on Nov. 13, 2014, the entire contents of which are incorporated herein by reference.

FIELD

Embodiments described herein relate to a semiconductor device and a method of manufacturing the same.

BACKGROUND

In recent years, fine patterns of a semiconductor device are often formed by sidewall transfer process. For example, word lines of a semiconductor storage device such as a NAND memory are formed by the sidewall transfer process for downscaling purposes in many cases. However, when the word lines are formed by the sidewall transfer process, the reduction of the line width and the space width of the word lines makes it difficult to form pad portions (hook-up portions), which are used to dispose contact plugs on the word lines. The reason is that the reduction of these widths makes it difficult, when lithography for processing the pad portions is performed, to perform the alignment in lithography for dividing the pad portions and cutting the word lines from the pad portions. Therefore, a method that can process the pad portions simply and accurately is demanded.

DETAILED DESCRIPTION

Embodiments will now be explained with reference to the accompanying drawings.

In one embodiment, a semiconductor device includes a substrate, and first to fourth interconnects provided on the substrate so as to be adjacent to one another. The device further includes a first pad portion connected with the first or second interconnect, and a second pad portion adjacent to the first pad portion in a first direction. The device further includes a third pad portion connected with the third or fourth interconnect, and adjacent to one of the first and second pad portions in a second direction perpendicular to the first direction, and a fourth pad portion adjacent to the third pad portion in the first direction, and adjacent to the other of the first and second pad portions in the second direction. The device further includes one or more interconnects electrically insulated from the first to fourth interconnects and the first to fourth pad portions, and provided between the first and second interconnects and the third and fourth interconnects.

First Embodiment

FIGS. 1A to 10B are plan views and cross-sectional views showing a method of manufacturing a semiconductor device of a first embodiment. The semiconductor device of the present embodiment is a NAND memory.

Figure 1A:
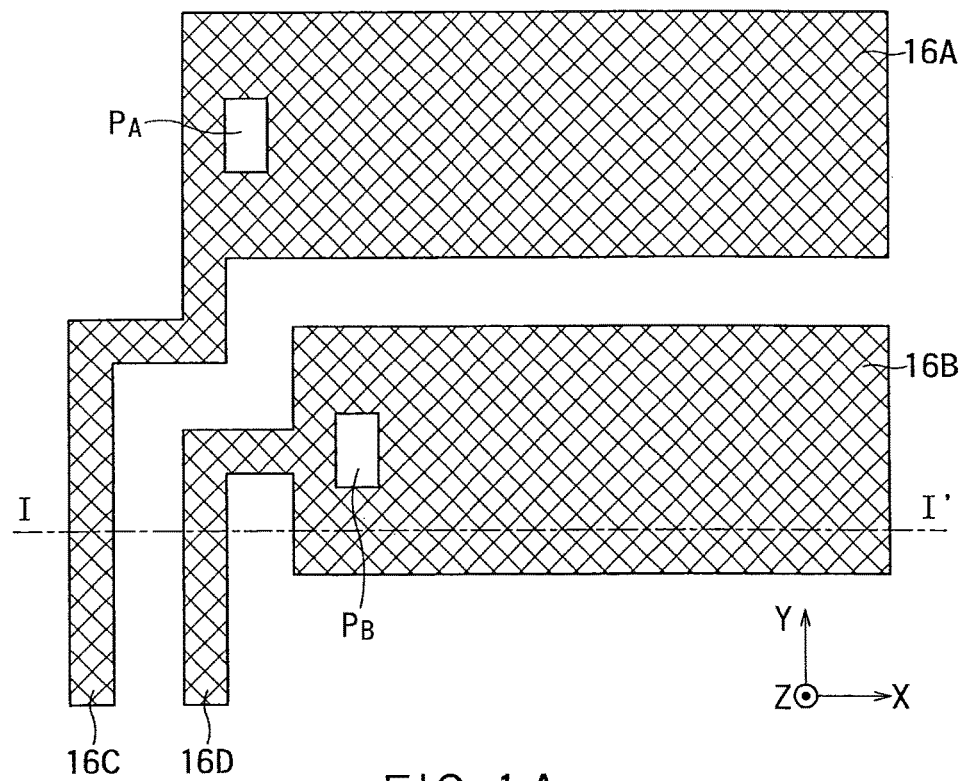
FIGS. 1A to 10B are plan views and cross-sectional views showing a method of manufacturing a semiconductor device of a first embodiment.
Figure 1B:
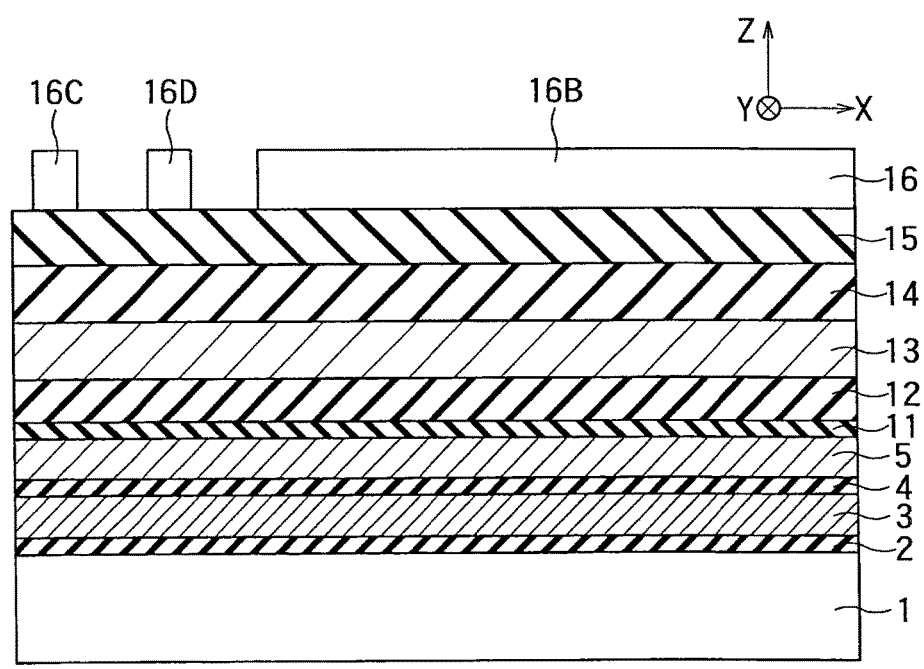

FIG. 1A is a plan view showing the semiconductor device of the present embodiment. FIG. 1B is a cross-sectional view taken along line I-I' in FIG. 1A. The same goes for FIGS. 2A to 10B.

[FIGS. 1A and 1B]

First, a gate insulator 2, a floating gate material 3, an inter gate insulator 4, a control gate material 5 that is an example of the interconnect layer, a first mask layer 11, a second mask layer 12, a hard mask layer 13 that is an example of the first film, a first core material 14 that is an example of the second film, a second core material 15 that is an example of the third film, and a resist film 16 are formed in order, on a substrate 1 (FIGS. 1A and 1B).

Examples of the substrate 1 include a semiconductor substrate such as a silicon substrate. FIGS. 1A and 1B show an X direction and Y direction that are parallel to the surface of the substrate 1 and that are perpendicular to each other, and show a Z direction that are perpendicular to the surface of the substrate 1. The X direction and the Y direction are examples of the first direction and the second direction, respectively.

In this specification, the +Z direction is handled as the upward direction, and the −Z direction is handled as the downward direction. For example, the positional relation between the substrate 1 and the resist film 16 is described as the substrate 1 being positioned below the resist film 16. The −Z direction in the present embodiment may agree with the gravity direction, or may disagree with the gravity direction.

Examples of the gate insulator 2 include a silicon oxide film. Examples of the floating gate material 3 include a polysilicon layer. Examples of the inter gate insulator 4 include a silicon oxide film, a silicon nitride film, and a laminated film including them. Examples of the control gate material 5 include a polysilicon layer, a metal layer, and a laminated film including them.

Examples of the first mask layer 11 include an insulator such as a silicon nitride film. Examples of the second mask layer 12 include a silicon oxide film. Examples of the hard mask layer 13 include a polysilicon layer and an amorphous silicon layer. Examples of the first core material 14 include a silicon oxide film. Examples of the second core material 15 include a silicon nitride film.

Next, the resist film 16 is processed by lithography (FIGS. 1A and 1B). As a result, the resist film 16 is processed into a resist pattern including belt portions 16A, 16B and line portions 16C, 16D.

The belt portions 16A, 16B extend in the X direction, and surround opening portions $P_A$, $P_B$, respectively. The line portions 16C, 16D extend mainly in the Y direction, and are connected with the belt portions 16A, 16B, respectively. The opening portions $P_A$, $P_B$ are positioned near end portions of the line portions 16C, 16D, respectively.

The resist pattern further includes multiple belt portions having the same shape as the belt portions 16A, 16B, and multiple line portions having the same shape as the line portions 16C, 16D, but the illustration of these is omitted in FIGS. 1A and 1B. The same goes for the other patterns shown in FIGS. 2A to 10B.

Figure 2A:
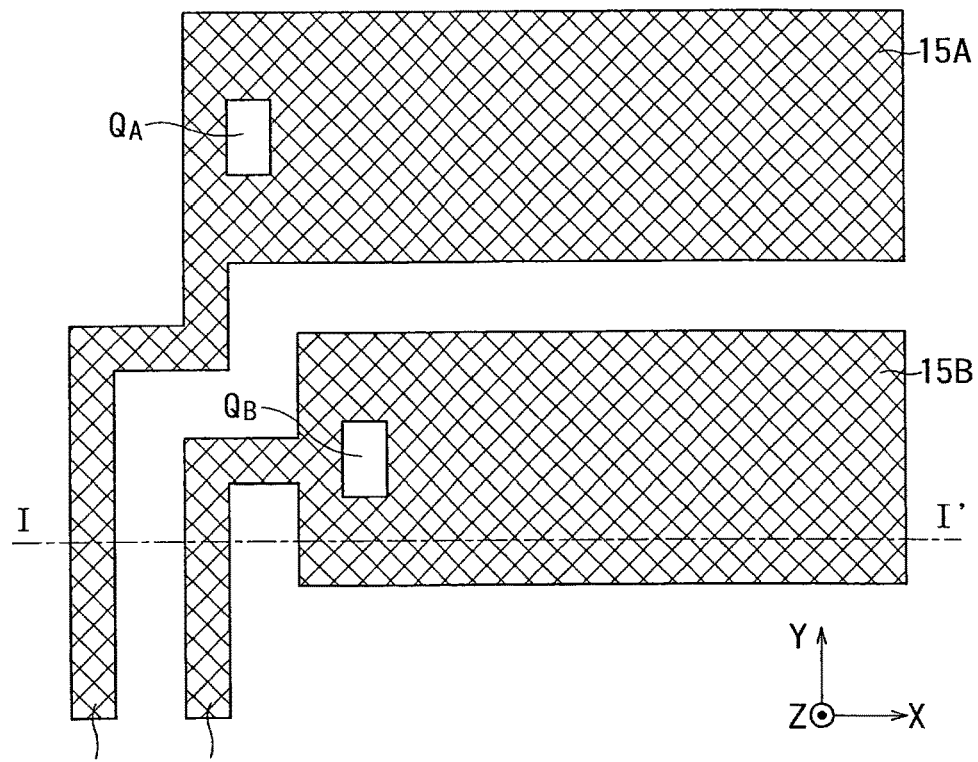
Figure 2B:
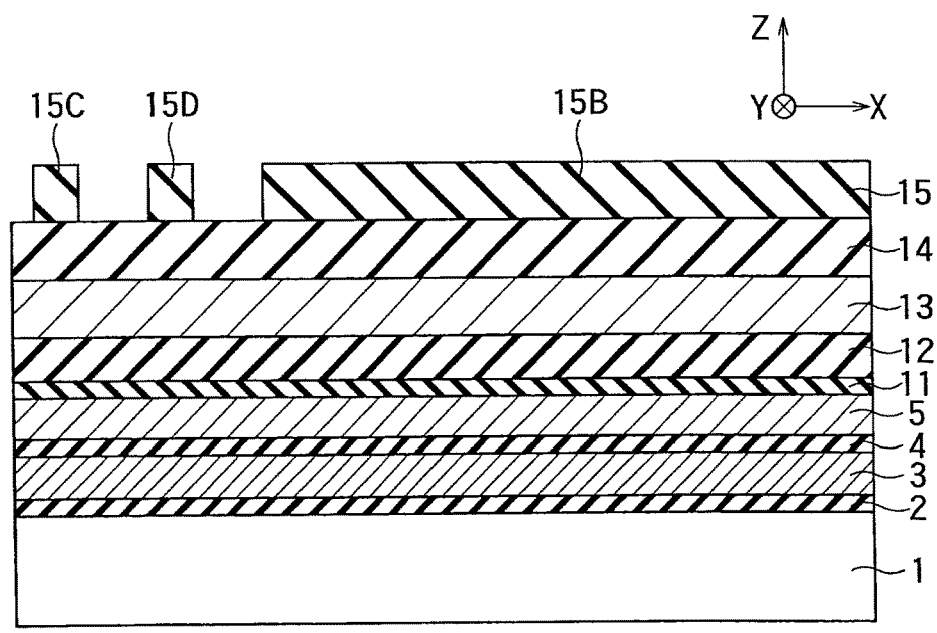

[FIGS. 2A and 2B]

Next, by the etching using the resist film 16 as a mask, the second core material 15 is processed (FIGS. 2A and 2B). As a result, the second core material 15 is processed into a core material pattern including belt portions 15A, 15B and line portions 15C, 15D. The core material pattern of the second core material 15 is an example of the first pattern. Further, examples of the above etching include a reactive ion etching (RIE).

The belt portions 15A, 15B extend in the X direction, and surround opening portions $Q_A$, $Q_B$, respectively. The line portions 15C, 15D extend mainly in the Y direction, and are connected with the belt portions 15A, 15B, respectively. The opening portions $Q_A$, $Q_B$ are positioned near end portions of the line portions 15C, 15D, respectively.

Figure 3A:
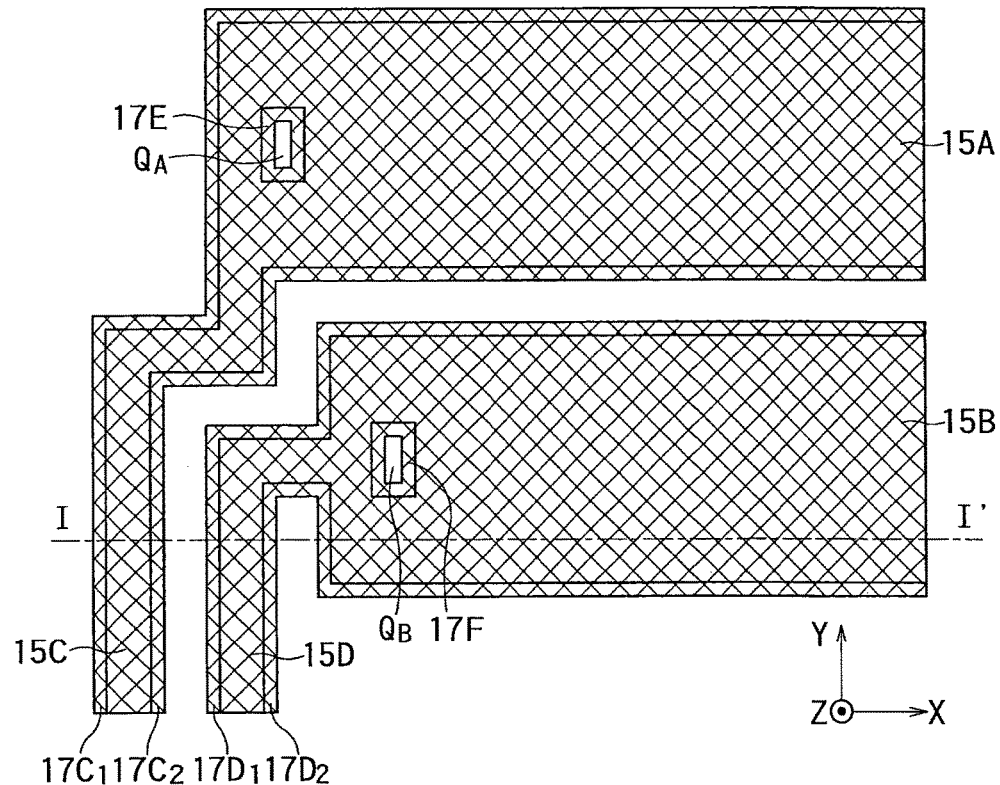
Figure 3B:
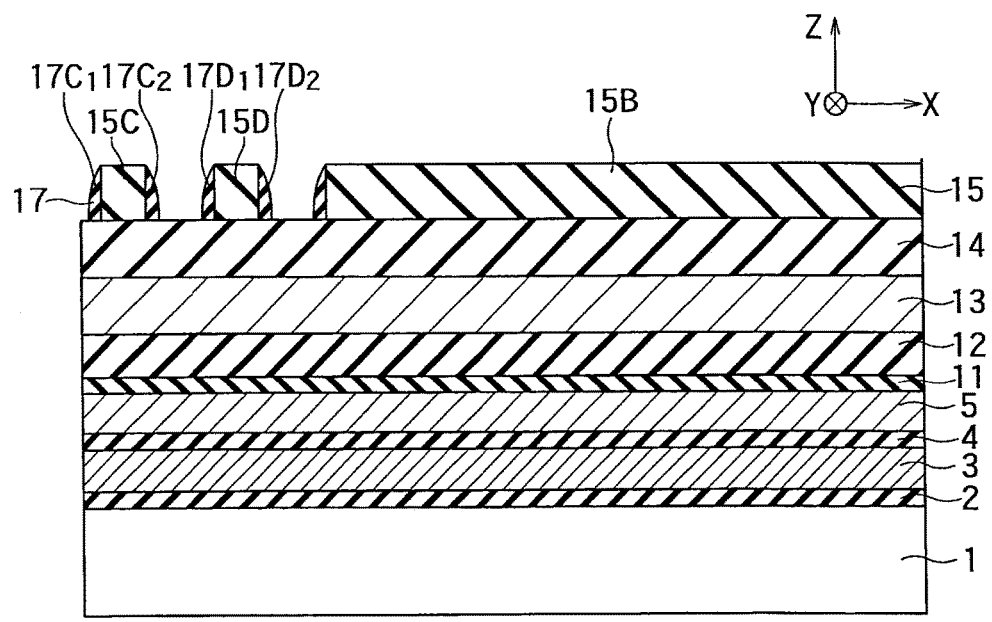

[FIGS. 3A and 3B]

Next, a first sidewall film 17 is formed on the side faces of the second core material 15 (FIGS. 3A and 3B). Examples of the first sidewall film 17 include a silicon oxide film.

The first sidewall film 17 includes line portions $17C_1$, $17C_2$ formed on the side faces of the belt portion 15A and line portion 15C of the second core material 15, and line portions $17D_1$, $17D_2$ formed on the side faces of the belt portion 15B and line portion 15D of the second core material 15.

The first sidewall film 17 further includes a dummy portion 17E formed on the side faces of the opening portion $Q_A$, and a dummy portion 17F formed on the side faces of the opening portion $Q_B$. The dummy portions 17E, 17F have a ring shape.

Figure 4A:
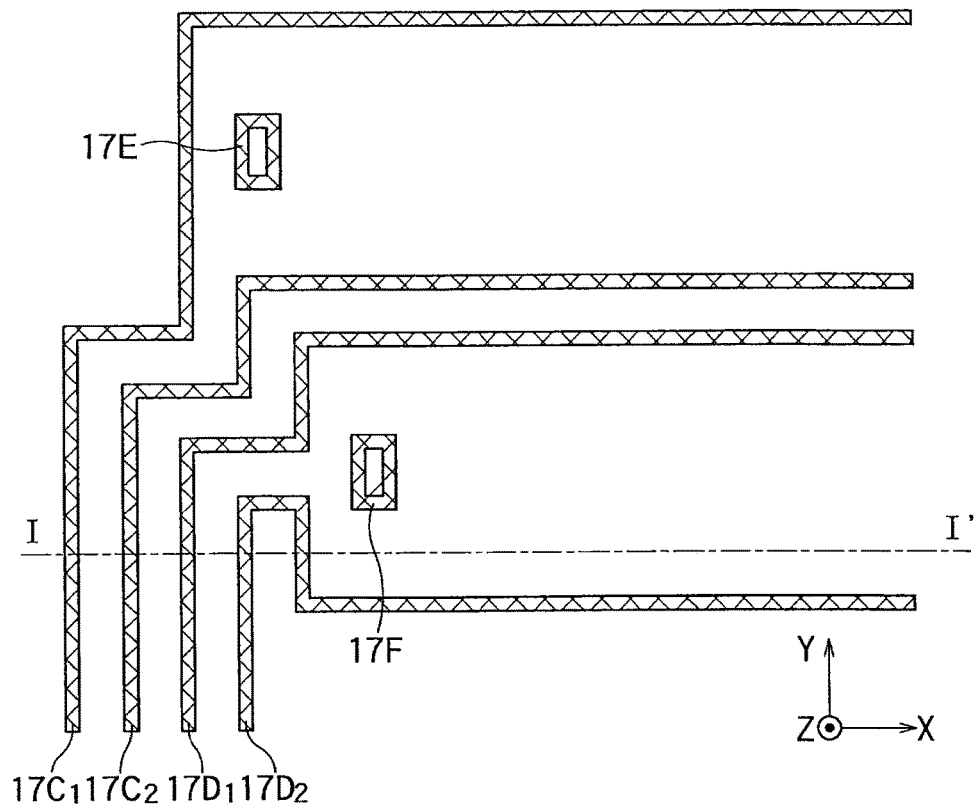
Figure 4B:
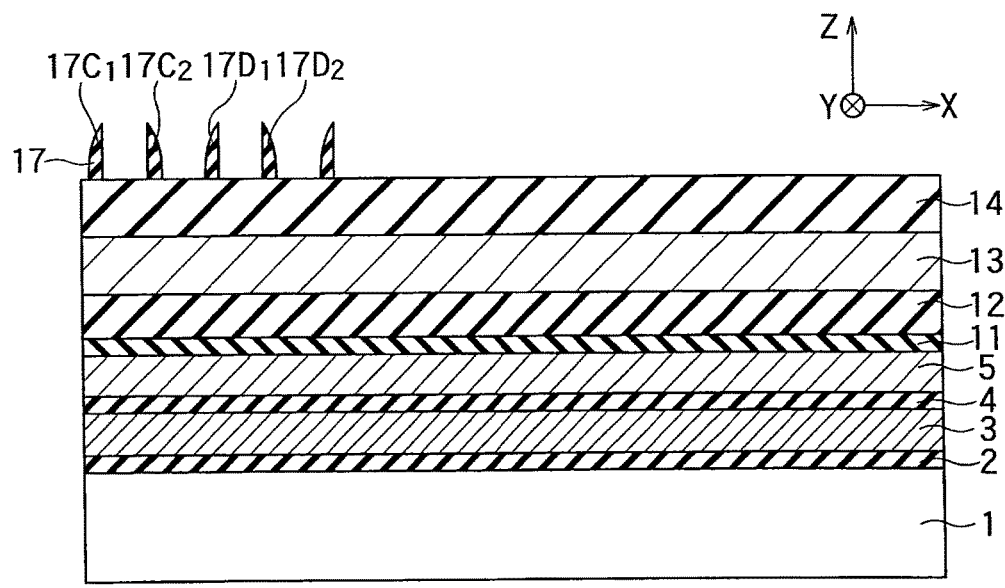

[FIGS. 4A and 4B]

Next, the second core material 15 is removed by etching or ashing (FIGS. 4A and 4B).

Figure 5A:
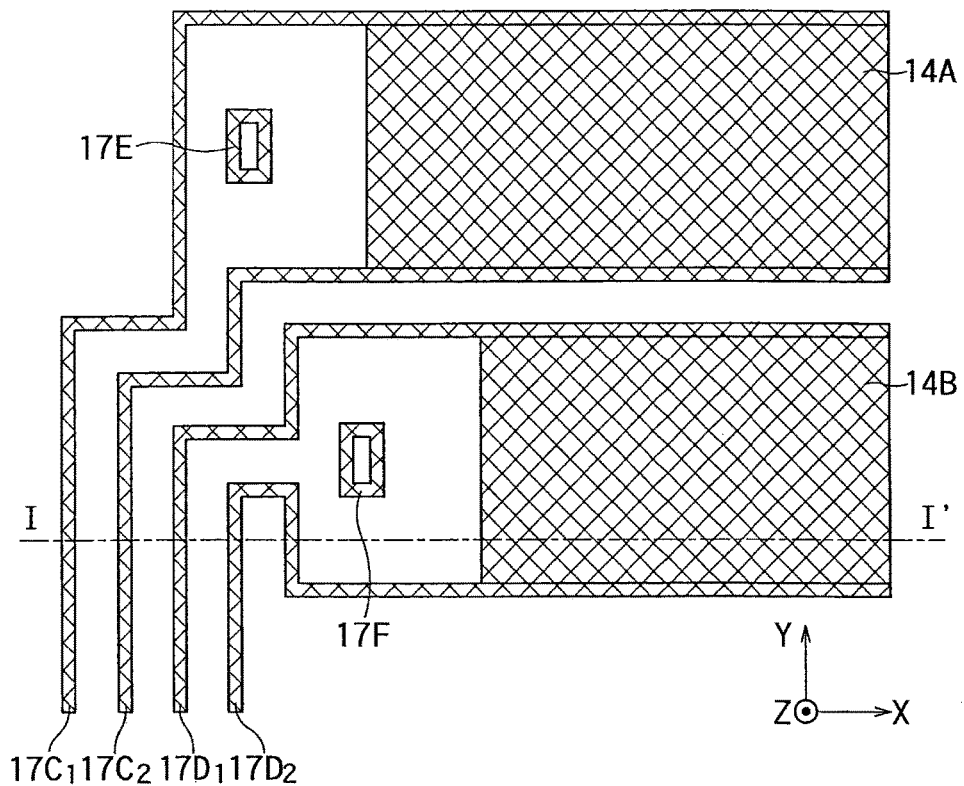
Figure 5B:
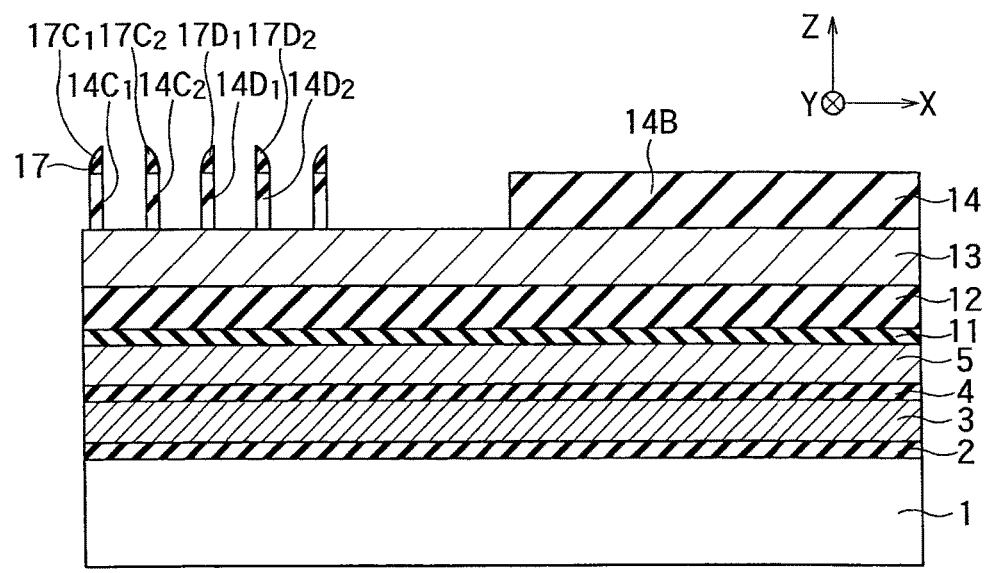

[FIGS. 5A and 5B]

Next, by the etching using the first sidewall film 17 as a mask, the first core material 14 is processed (FIGS. 5A and 5B). As a result, the first core material 14 is processed into a core material pattern including belt portions 14A, 14B, line portions $14C_1$, $14C_2$, $14D_1$, $14D_2$, and dummy portions 14E, 14F. The core material pattern of the first core material 14 is an example of the second pattern. Further, examples of the above etching include an RIE. The dummy portions 14E, 14F, for which the illustration is omitted for the convenience of the figure drawing, are positioned under the dummy portions 17E, 17F, respectively.

The belt portions 14A, 14B extend in the X direction. The line portions $14C_1$, $14C_2$, $14D_1$, $14D_2$ extend mainly in the Y direction. The line portions $14C_1$, $14C_2$ are connected with the belt portion 14A, and the line portions $14D_1$, $14D_2$ are connected with the belt portion 14B.

The dummy portion 17E is separated from the belt portion 14A and the line portions $14C_1$, $14C_2$, and is positioned between the line portion $14C_1$ and the line portion $14C_2$. The dummy portion 17E is adjacent to the belt portion 14A in the X direction. The line portions $14C_1$, $14C_2$ are examples of the first and second line portions, respectively, and the dummy portion 17E is an example of the portion that is positioned between the first line portion and the second line portion.

The dummy portion 17F is separated from the belt portion 14B and the line portions $14D_1$, $14D_2$, and is positioned between the line portion $14D_1$ and the line portion $14D_2$. The dummy portion 17F is adjacent to the belt portion 14B in the X direction. The line portions $14D_1$, $14D_2$ are examples of the first and second line portions, respectively, and the dummy portion 17F is an example of the portion that is positioned between the first line portion and the second line portion.

The line portions $17C_1$, $17C_2$, $17D_1$, $17D_2$ and dummy portions 17E, 17F of the first sidewall film 17 are transferred to the first core material 14, and thereby, the line portions $14C_1$, $14C_2$, $14D_1$, $14D_2$ and dummy portions 14E, 14F in the present embodiment are formed.

On the other hand, the belt portions 14A, 14B in the present embodiment are formed by the reverse loading effect. The reverse loading effect accelerates the etching rate for narrow space patterns, and decelerates the etching rate for wide space patterns. The reason is that the narrow space patterns are largely affected by the etching, compared to the wide space patterns.

In the present embodiment, the space between the line portions $17C_1$, $17C_2$ is wide at a region in the +X direction from the dummy portion 17E. Therefore, in the steps of FIGS. 5A and 5B, the first core material 14 at this region remains, and the belt portion 14A is formed.

Similarly, the space between the line portions $17D_1$, $17D_2$ is wide at a region in the +X direction from the dummy portion 17F. Therefore, in the steps of FIGS. 5A and 5B, the first core material 14 at this region remains, and the belt portion 14B is formed.

Figure 6A:
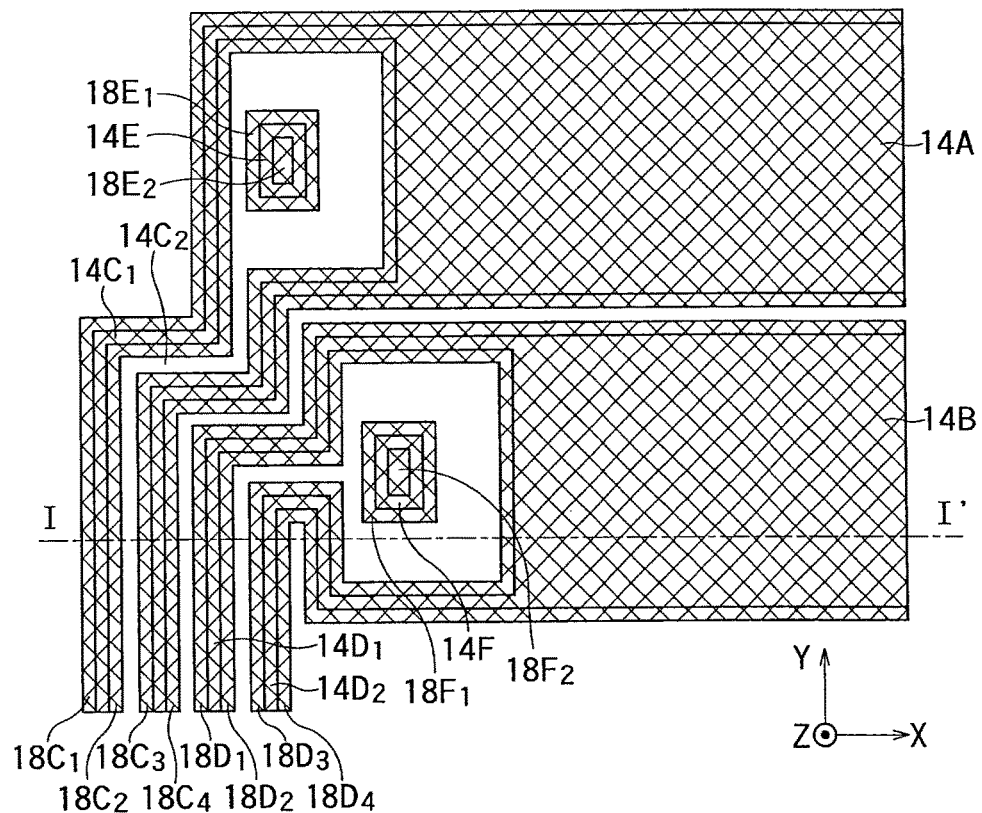
Figure 6B:
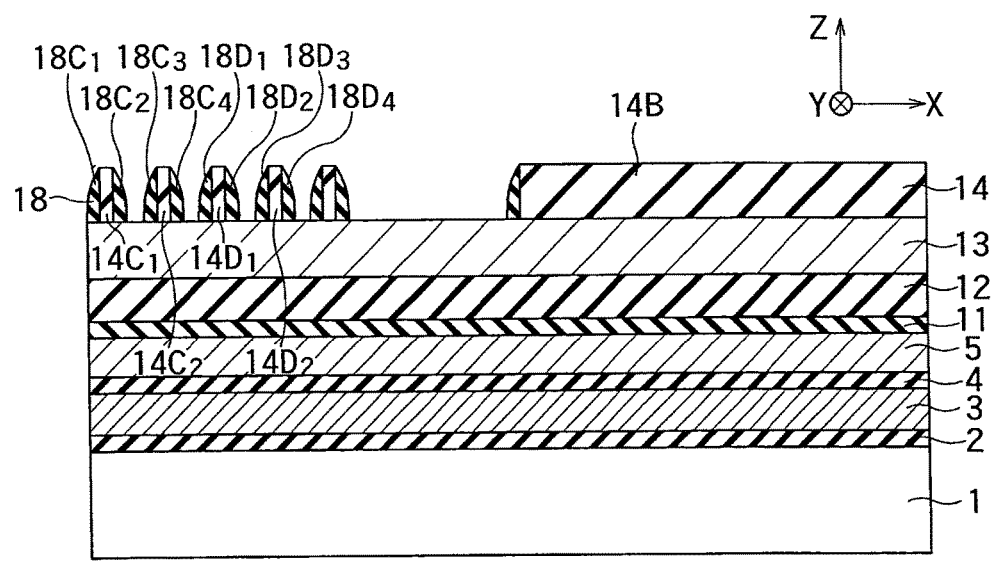

[FIGS. 6A and 6B]

Next, a second sidewall film 18 is formed on the side faces of the first core material 14 (FIGS. 6A and 6B). Examples of the second sidewall film 18 include a silicon nitride film.

The second sidewall film 18 includes line portions $18C_1$ to $18C_4$ formed on the side faces of the belt portion 14A and line portions $14C_1$, $14C_2$ of the first core material 14, and line portions $18D_1$ to $18D_4$ formed on the side faces of the belt portion 14B and line portions $14D_1$, $14D_2$ of the first core material 14.

The second sidewall film 18 further includes dummy portions $18E_1$, $18E_2$ formed on the side faces of the dummy portion 14E, and dummy portions $18F_1$, $18F_2$ formed on the side faces of the dummy portion 14F. The dummy portions $18E_1$, $18F_1$ have a ring shape, and the dummy portions $18E_2$, $18F_2$ have a line shape.

The line portions $18C_2$, $18C_3$ are connected with each other at a region between the belt portion 14A and the dummy portion 14E. Further, the line portions $18D_2$, $18D_3$ are connected with each other at a region between the belt portion 14B and the dummy portion 14F.

Figure 7A:
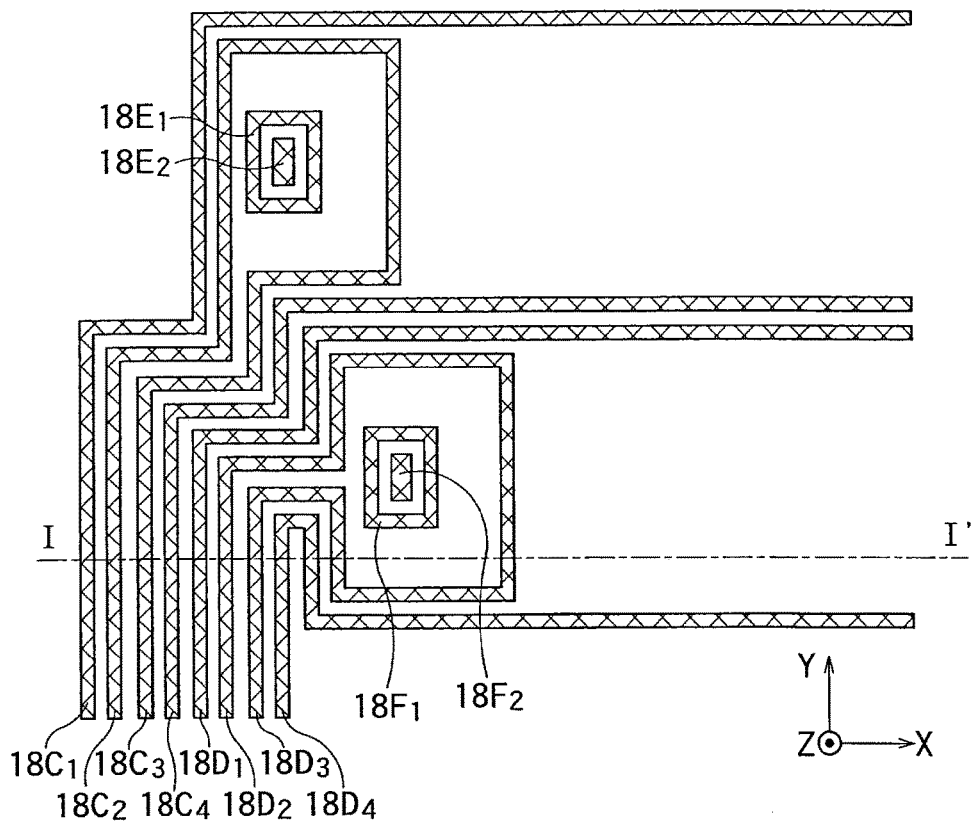
Figure 7B:
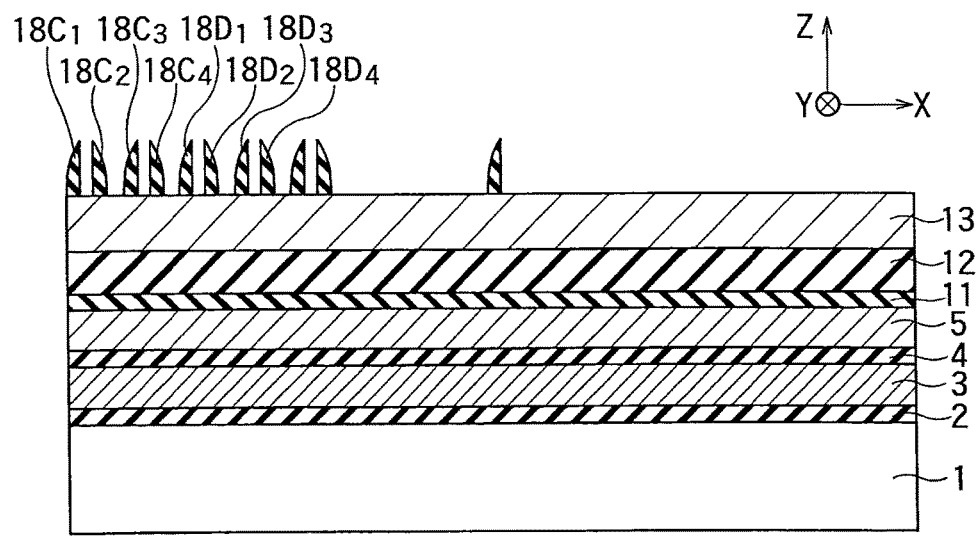

[FIGS. 7A and 7B]

Next, the first core material 14 is removed by etching or ashing (FIGS. 7A and 7B).

Figure 8A:
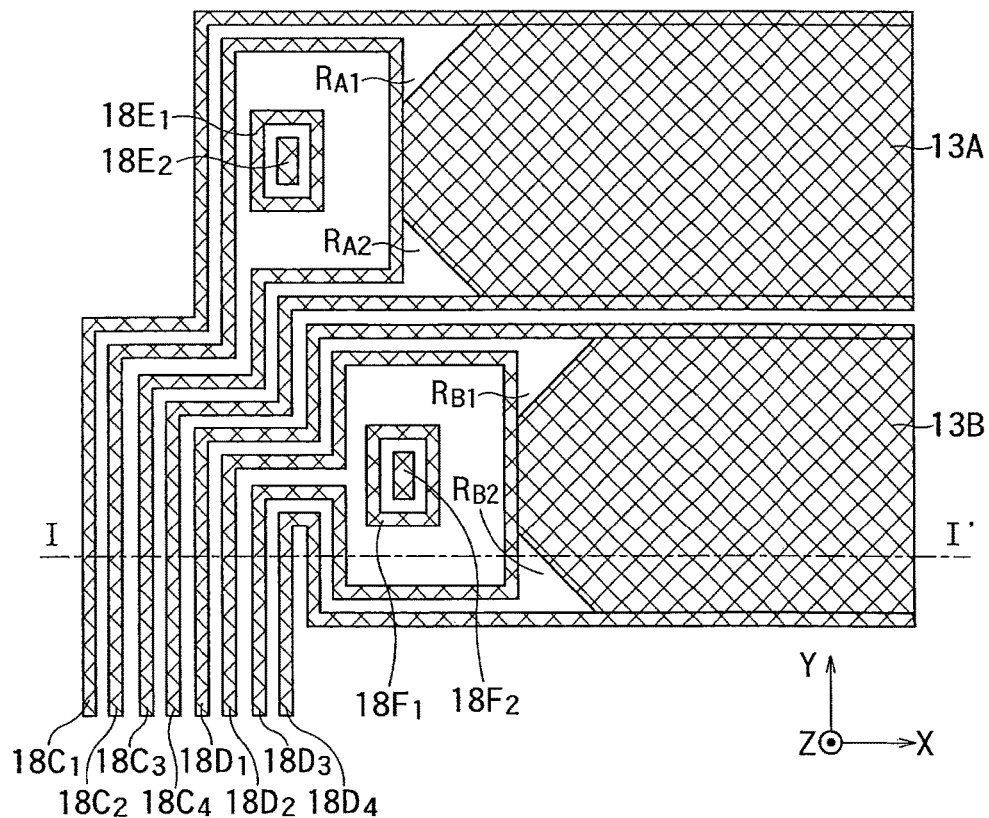
Figure 8B:
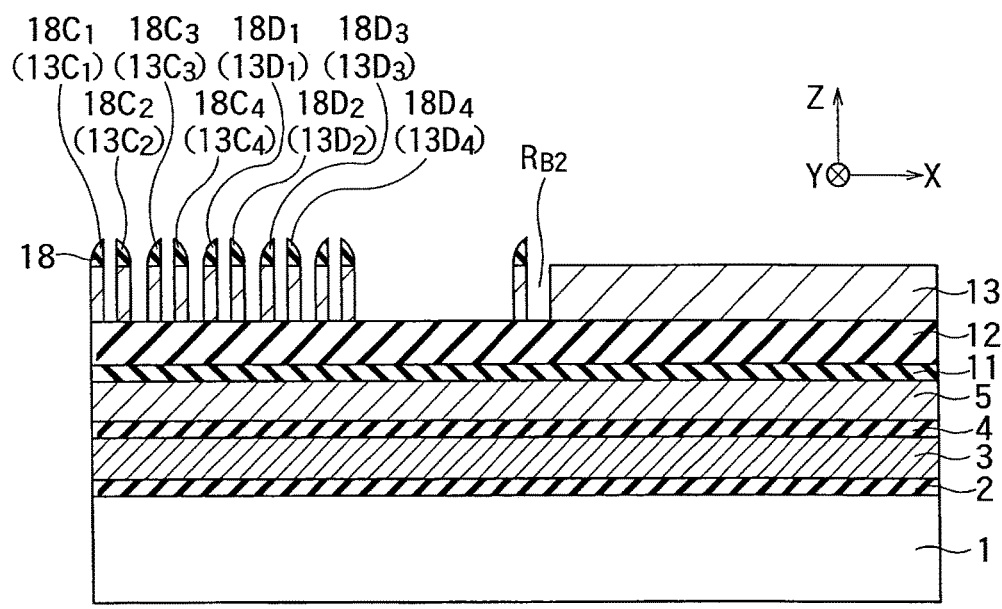

[FIGS. 8A and 8B]

Next, by the etching using the second sidewall film 18 as a mask, the hard mask layer 13 is processed (FIGS. 8A and 8B). As a result, the hard mask layer 13 is processed into a hard mask pattern including belt portions 13A, 13B, line portions $13C_1$ to $13C_4$, $13D_1$ to $13D_4$ and dummy portions $13E_1$, $13E_2$, $13F_1$, $13F_2$. The hard mask pattern is an example of the third pattern. Further, examples of the above etching include an RIE. The dummy portions $13E_1$, $13E_2$, $13F_1$, $13F_2$, for which the illustration is omitted for the convenience of the figure drawing, are positioned under the dummy portions $18E_1$, $18E_2$, $18F_1$, $18F_2$, respectively.

The belt portions 13A, 13B extend in the X direction. The line portions $13C_1$ to $13C_4$, $13D_1$ to $13D_4$ extend mainly in the Y direction. The line portions $13C_1$ to $13C_4$ are connected with the belt portion 13A, and the line portions $13D_1$ to $13D_4$ are connected with the belt portion 13B.

The dummy portions $13E_1$, $13E_2$ are separated from the belt portion 13A and the line portions $13C_1$ to $13C_4$, and are positioned between the line portions $13C_1$, $13C_2$ and the line portions $13C_3$, $13C_4$. The dummy portions $13E_1$, $13E_2$ are adjacent to the belt portion 13A in the X direction. The line portions $13C_1$ to $13C_4$ are examples of the first to fourth line portions, respectively, and the dummy portions $13E_1$, $13E_2$ are examples of the portion that is positioned between the first and second line portions and the third and fourth line portions.

The dummy portions $13F_1$, $13F_2$ are separated from the belt portion 13B and the line portions $13D_1$ to $13D_4$, and are positioned between the line portions $13D_1$, $13D_2$ and the line portions $13D_3$, $13D_4$. The dummy portions $13F_1$, $13F_2$ are adjacent to the belt portion 13B in the X direction. The line portions $13D_1$ to $13D_4$ are examples of the first to fourth line portions, respectively, and the dummy portions $13F_1$, $13F_2$ are examples of the portion that is positioned between the first and second line portions and the third and fourth line portions.

The line portions $18C_1$ to $18C_4$, $18D_1$ to $18D_4$ and dummy portions $18E_1$, $18E_2$, $18F_1$, $18F_2$ of the second sidewall film 18 are transferred to the hard mask layer 13, and thereby, the line portions $13C_1$ to $13C_4$, $13D_1$ to $13D_4$ and dummy portions $13E_1$, $13E_2$, $13F_1$, $13F_2$ in the present embodiment are formed.

On the other hand, the belt portions 13A, 13B in the present embodiment are formed by the reverse loading effect. The reverse loading effect accelerates the etching rate for narrow space patterns, and decelerates the etching rate for wide space patterns. The reason is that the narrow space patterns are largely affected by etching, compared to the wide space patterns.

In the present embodiment, the space between the line portions $18C_1$, $18C_4$ is wide at a region in the +X direction from the connecting portion between the line portions $18C_2$, $18C_3$. Therefore, in the steps of FIGS. 8A and 8B, the hard mask layer 13 at this region remains, and the belt portion 13A is formed. However, the belt portion 13A is formed such that opening portions $R_{A1}$, $R_{A2}$ remain at corner portions of the belt portion 13A. The reason is that the distance between the line portions $18C_1$, $18C_2$ and the distance between the line portions $18C_3$, $18C_4$ are short near the corner portions.

Similarly, the space between the line portions $18D_1$, $18D_4$ is wide at a region in the +X direction from the connecting portion between the line portions $18D_2$, $18D_3$. Therefore, in the steps of FIGS. 8A and 8B, the hard mask layer 13 at this region remains, and the belt portion 13B is formed. However, the belt portion 13B is formed such that opening portions $R_{B1}$, $R_{B2}$ remain at corner portions of the belt portion 13B. The reason is the same as the case of the belt portion 13A.

Figure 9A:
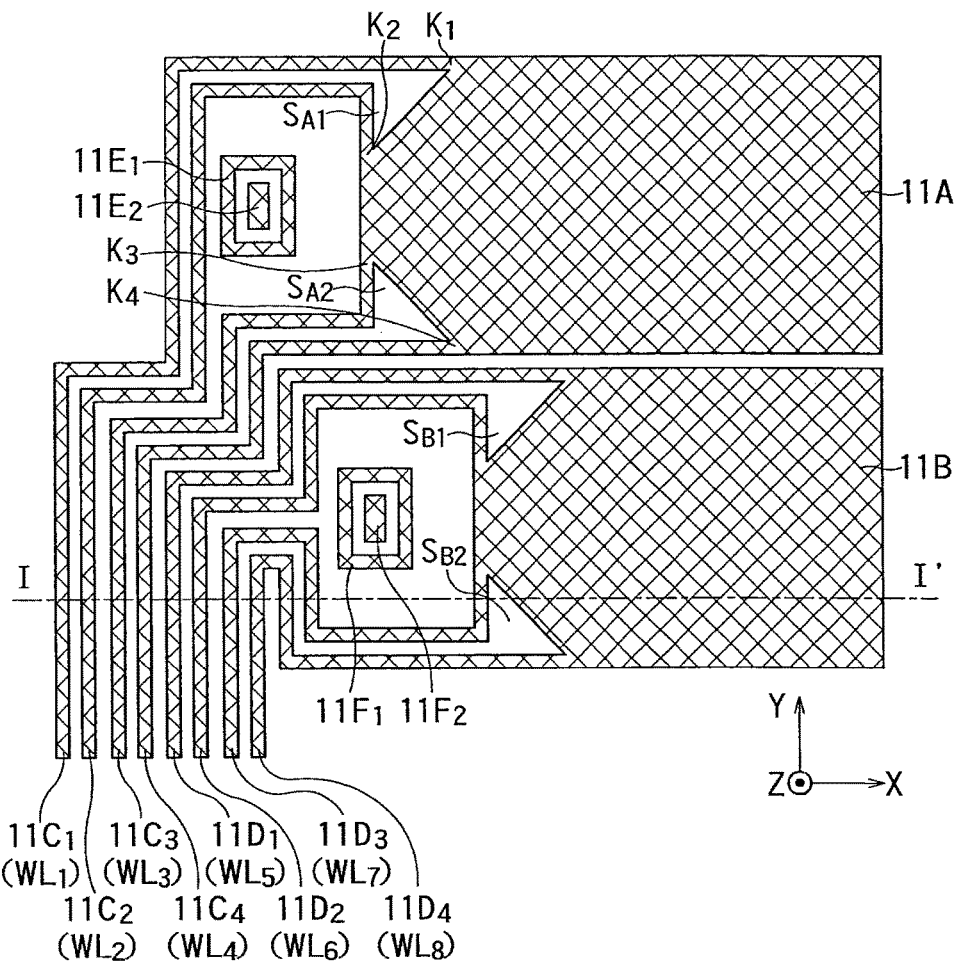
Figure 9B:
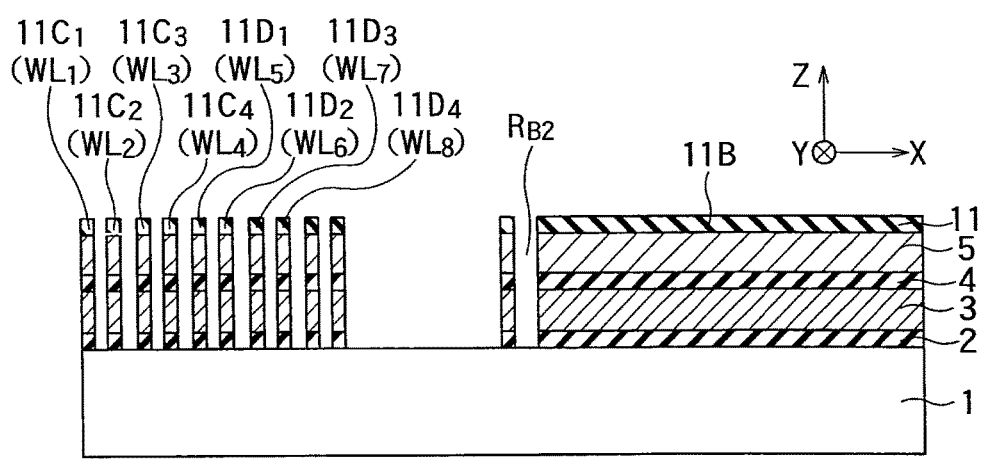

[FIGS. 9A and 9B]

Next, by the etching using the hard mask layer 13 as a mask, the second mask layer 12, the first mask layer 11, the control gate material 5, the inter gate insulator 4, the floating gate material 3, and the gate insulator 2 are processed (FIGS. 9A and 9B). As a result, the first mask layer 11 is processed into a mask pattern including belt portions 11A, 11B, line portions $11C_1$ to $11C_4$, $11D_1$ to $11D_4$ and dummy portions $11E_1$, $11E_2$, $11F_1$, $11F_2$. Examples of the above etching include an RIE.

The same goes for the control gate material 5, the inter gate insulator 4, the floating gate material 3, and the gate insulator 2. For example, the control gate material 5 is processed into an interconnect pattern including belt portions 5A, 5B, line portions $5C_1$ to $5C_4$, $5D_1$ to $5D_4$, and dummy portions $5E_1$, $5E_2$, $5F_1$, $5F_2$.

The belt portions 5A, 5B, the line portions $5C_1$ to $5C_4$, $5D_1$ to $5D_4$, and the dummy portions $5E_1$, $5E_2$, $5F_1$, $5F_2$, for which the illustration of the reference characters and the shapes is omitted for the convenience of the figure drawing, are positioned under the belt portions 11A, 11B, the line portions $11C_1$ to $11C_4$, $11D_1$ to $11D_4$ and the dummy portions $11E_1$, $11E_2$, $11F_1$, $11F_2$, respectively. The line portions $5C_1$ to $5C_4$, $5D_1$ to $5D_4$ function as word lines $WL_1$ to $WL_8$, respectively.

The belt portions 11A, 11B extend in the X direction. The line portions $11C_1$ to $11C_4$, $11D_1$ to $11D_4$ extend mainly in the Y direction, and are arranged so as to be adjacent to each other. The line portions $11C_1$ to $11C_4$ are connected with the belt portion 11A, and the line portions $11D_1$ to $11D_4$ are connected with the belt portion 11B. The same goes for the belt portions 5A, 5B, and the line portions $5C_1$ to $5C_4$, $5D_1$ to $5D_4$.

The dummy portions $11E_1$, $11E_2$ are separated from the belt portion 11A and the line portions $11C_1$ to $11C_4$, and are positioned between the line portions $11C_1$, $11C_2$ and the line portions $11C_3$, $11C_4$. The dummy portions $11E_1$, $11E_2$ are adjacent to the belt portion 11A in the X direction. The dummy portion $11E_1$ has a ring shape, and the dummy portion $11E_2$ has a line shape. The same goes for the line portions $5C_1$ to $5C_4$ and the dummy portions $5E_1$, $5E_2$. The line portions $5C_1$ to $5C_4$ are examples of the first to fourth interconnects, respectively. The dummy portions $5E_1$, $5E_2$ are examples of the one or more interconnects. The dummy portions $5E_1$, $5E_2$ are separated (electrically insulated) from the belt portion 5A and the line portions $5C_1$ to $5C_4$.

The dummy portions $11F_1$, $11F_2$ are separated from the belt portion 11B and the line portions $11D_1$ to $11D_4$, and are positioned between the line portions $11D_1$, $11D_2$ and the line portions $11D_3$, $11D_4$. The dummy portions $11F_1$, $11F_2$ are adjacent to the belt portion 11B in the X direction. The dummy portion $11F_1$ has a ring shape, and the dummy portion $11F_2$ has a line shape. The same goes for the line portions $5D_1$ to $5D_4$ and the dummy portions $5F_1$, $5F_2$. The line portions $5D_1$ to $5D_4$ are examples of the first to fourth interconnects, respectively. The dummy portions $5F_1$, $5F_2$ are examples of the one or more interconnects. The dummy portions $5F_1$, $5F_2$ are separated (electrically insulated) from the belt portion 5B and the line portions $5D_1$ to $5D_4$.

Similarly to the belt portion 13A, the belt portion 11A in the present embodiment is formed such that opening portions $S_{A1}$, $S_{A2}$ remain at corner portions of the belt portion 11A. Reference characters $K_1$ to $K_4$ denote end portions of the line portions $11C_1$ to $11C_4$, respectively. The line portions $11C_1$ to $11C_4$ are connected with the belt portion 11A at the end portions $K_1$ to $K_4$, respectively. The same goes for the belt portion 11B and the line portions $11D_1$ to $11D_4$. Furthermore, the same goes for the belt portions 5A, 5B and the line portions $5C_1$ to $5C_4$, $5D_1$ to $5D_4$.

In the present embodiment, due to the opening portion $S_{A1}$, the distance between the end portion $K_1$ of the line portion $11C_1$ and the end portion $K_2$ of the line portion $11C_2$ is greater than the space width between the line portion $11C_1$ and the line portion $11C_2$. Furthermore, due to the opening portion $S_{A2}$, the distance between the end portion $K_3$ of the line portion $11C_3$ and the end portion $K_4$ of the line portion $11C_4$ is greater than the space width between the line portion $11C_3$ and the line portion $11C_4$. The same goes for the line portions $11D_1$ to $11D_4$. Furthermore, the same goes for the line portions $5C_1$ to $5C_4$, $5D_1$ to $5D_4$.

The space width between the line portion $11C_1$ and the line portion $11C_2$, and the space width between the line portion $11C_3$ and the line portion $11C_4$ are specified by the major portions of these line portions $11C_1$ to $11C_4$, that is, by the portions where these line portions $11C_1$ to $11C_4$ extend in the Y direction. Therefore, these space widths are roughly equal to the line widths of the line portions $17C_1$, $17C_2$ of the first sidewall film 17, and the line widths of the line portions $14C_1$, $14C_2$ of the first core material 14.

Figure 10A:
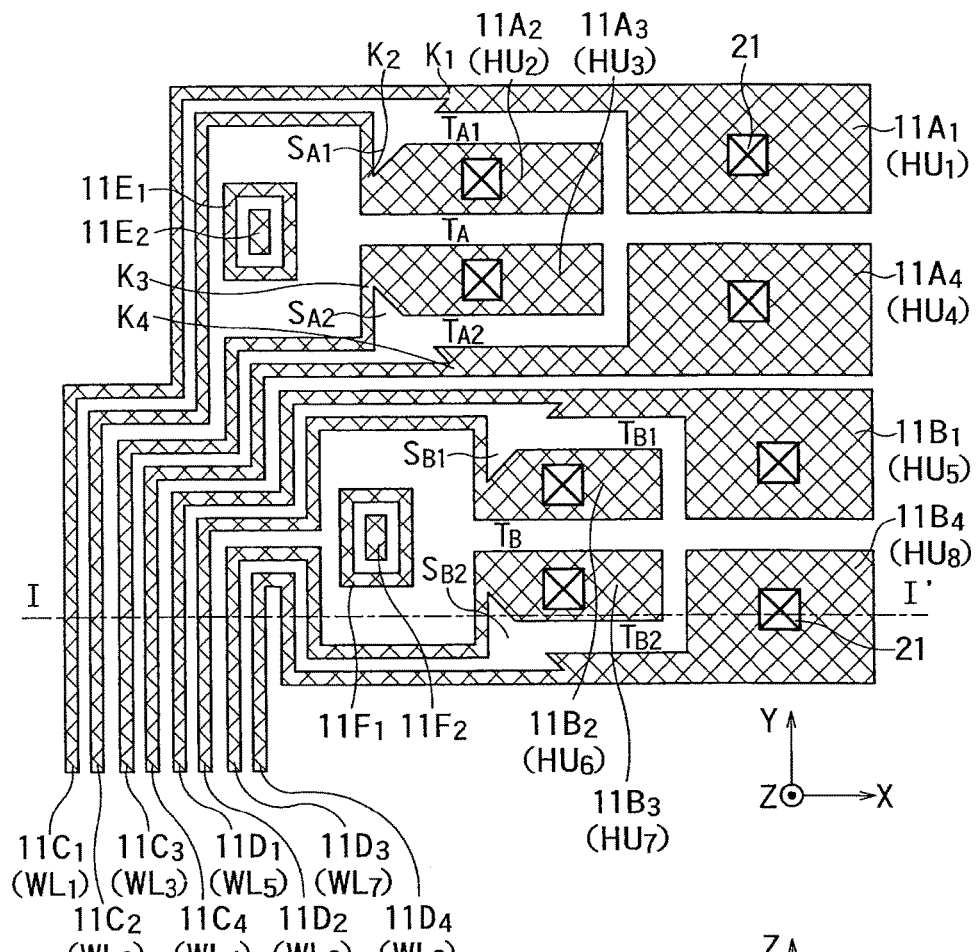
Figure 10B:
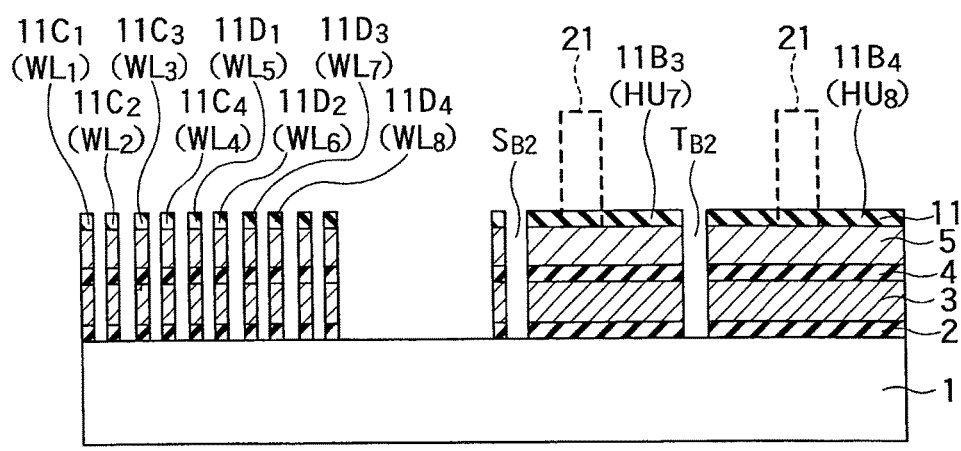

[FIGS. 10A and 10B]

Next, the belt portions 11A, 11B are divided by lithography and etching (FIGS. 10A and 10B). The same goes for the control gate material 5, the inter gate insulator 4, the floating gate material 3 and the gate insulator 2. Examples of the above etching include an RIE.

The belt portion 11A is divided by trenches $T_A$, $T_{A1}$, $T_{A2}$. The trench $T_A$ extends in the X direction such that the belt portion 11A is divided into two. The trench $T_{A1}$ extends in the X direction and the Y direction such that the trench $T_A$ and the opening portion $S_{A1}$ are linked. The trench $T_{A2}$ extends in the X direction and the Y direction such that the trench $T_A$ and the opening portion $S_{A2}$ are linked.

As a result, the belt portion 11A is divided into belt portions $11A_1$ to $11A_4$ that are connected with the line portions $11C_1$ to $11C_4$, respectively. The belt portions $11A_1$, $11A_2$ are adjacent to each other in the X direction, and the belt portions $11A_3$, $11A_4$ are adjacent to each other in the X direction. Further, the belt portions $11A_1$, $11A_4$ are adjacent to each other in the Y direction, and the belt portions $11A_2$, $11A_3$ are adjacent to each other in the Y direction.

In the present embodiment, a part of the belt portion $11A_1$ is positioned in the +Y direction from the belt portion $11A_2$, and a part of the belt portion $11A_4$ is positioned in the −Y direction from the belt portion $11A_3$. Therefore, the belt portions $11A_1$, $11A_2$ are adjacent to each other in the Y direction. Similarly, the belt portions $11A_3$, $11A_4$ are adjacent to each other in the Y direction.

Similarly to the belt portion 11A, the belt portion 5A is divided into belt portions $5A_1$ to $5A_4$ that are connected with the line portions $5C_1$ to $5C_4$, respectively. While the line portions $5C_1$ to $5C_4$ function as the word lines $WL_1$ to $WL_4$, respectively, the belt portions $5A_1$ to $5A_4$ function as pad portions (hook-up portions) $HU_1$ to $HU_4$ for the word lines $WL_1$ to $WL_4$, respectively.

The same goes for the belt portion 11B and the belt portion 5B. Similarly to the belt portion 11B, the belt portion 5B is divided into belt portions $5B_1$ to $5B_4$ that are connected with line portions $5D_1$ to $5D_4$, respectively. While the line portions $5D_1$ to $5D_4$ function as the word lines $WL_5$ to $WL_8$, respectively, the belt portions $5B_1$ to $5B_4$ function as pad portions $HU_5$ to $HU_8$ for the word lines $WL_5$ to $WL_8$, respectively.

Thereafter, in the present embodiment, an inter layer dielectric is formed on the whole surface of the substrate 1, contact holes that penetrate the inter layer dielectric and reach the pad portions $HU_1$ to $HU_8$ are formed, and contact plugs 21 are formed on the pad portions $HU_1$ to $HU_8$ in the contact holes. Furthermore, various interconnect layers, plug layers, inter layer dielectrics and the like are formed on the substrate 1. In this way, the semiconductor device of the present embodiment is manufactured.

Figure 11:
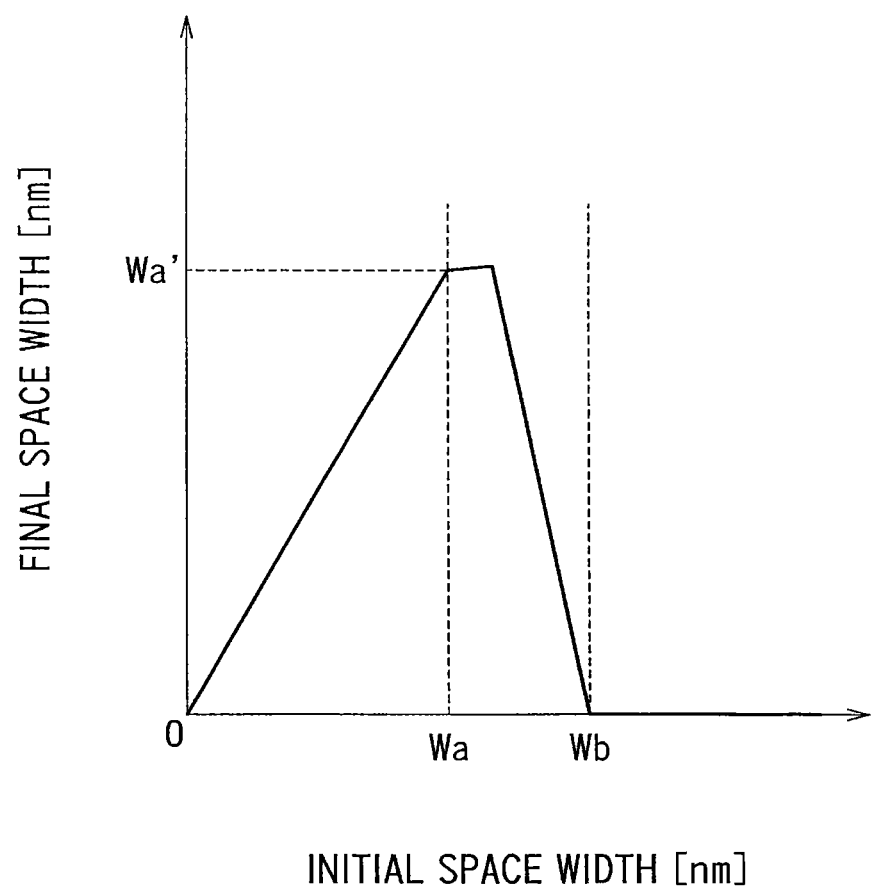
FIG. 11 is a graph showing a relation of an initial space width between patterns of an upper layer and a final space width between patterns of a lower layer, when the patterns of the upper layer are transferred to the lower layer.

FIG. 11 is a graph showing a relation of an initial space width between patterns of an upper layer and a final space width between patterns of a lower layer, when the patterns of the upper layer are transferred to the lower layer.

In the case where the initial space width is "Wa" or less, the final space width changes so as to be roughly proportional to the initial space width. For example, in the case where the initial space width is "Wa", the final space width is "Wa'", which is close to "Wa". Therefore, in the case where the initial space width is "Wa" or less, the shape of the patterns of the lower layer is roughly equal to the shape of the patterns of the upper layer.

However, when the initial space width increases to a range of "Wa" to "Wb", the change rate of the final space width decreases from a positive value to about 0, and further changes to a negative value. Further, in the case where the initial space width is "Wb" or more, the final space width is 0. Therefore, in the case where the initial space width is "Wb" or more, the patterns of the upper layer are not transferred to the lower layer.

Therefore, in the present embodiment, the space width between the line portions $17C_1$, $17C_2$ and the space widths between the line portions $18C_1$ to $18C_4$ are set to "Wa" or less. As a result, the patterns of the line portions $17C_1$, $17C_2$ are transferred to the first core material 14, as shown in FIGS. 5A and 5B. Furthermore, the patterns of the line portions $18C_1$ to $18C_4$ are transferred to the hard mask layer 13, as shown in FIGS. 8A and 8B.

Further, in the present embodiment, the space between the line portions $17C_1$, $17C_2$ in the +X direction from the dummy portions 17E and the space between the line portions $18C_1$, $18C_4$ in the +X direction from the connecting portion of the line portions $18C_2$, $18C_3$ are set to a width of "Wb" or more. As a result, the belt portion 14A is formed by the reverse loading effect, as shown in FIGS. 5A and 5B. Furthermore, the belt portion 13A is formed by the reverse loading effect, as shown in FIGS. 8A and 8B.

Further, in the present embodiment, the dummy portion 17E is formed between the line portion $17C_1$ and the line portion $17C_2$, and the dummy portions $18E_1$, $18E_2$ are formed between the line portions $18C_1$, $18C_2$ and the line portions $18C_3$, $18C_4$. As a result, a space remains between the belt portion 14A and the dummy portion 17E, as shown in FIGS. 5A and 5B. Furthermore, the opening portions $R_{A1}$, $R_{A2}$ remain at the corner portions of the belt portion 13A, as shown in FIGS. 8A and 8B.

Therefore, according to the present embodiment, by using the space and opening portions $R_{A1}$, $R_{A2}$, the trenches $T_A$, $T_{A1}$, $T_{A2}$ are easily formed in the belt portion 11A, and the belt portion 11A is easily divided. In the present embodiment, the trenches $T_A$, $T_{A1}$, $T_{A2}$ may be formed in the belt portion 11A, by using the above-described space and without using the opening portions $R_{A1}$, $R_{A2}$. An example of such a method will be explained in a modification of a second embodiment.

In the present embodiment, as shown in FIGS. 2A and 2B, the belt portion 15A is formed so as to surround the opening portion $Q_4$. Therefore, according to the present embodiment, the dummy portion 17E can be formed between the line portion $17C_1$ and the line portion $17C_2$, and the space can remain between the belt portion 14A and the dummy portion 17E (FIGS. 5A and 5B). Further, according to the present embodiment, the dummy portions $18E_1$, $18E_2$ can be formed between the line portions $18C_1$, $18C_2$ and the line portions $18C_3$, $18C_4$, and the opening portions $R_{A1}$, $R_{A2}$ can remain at the corner portions of the belt portion 13A (FIGS. 8A and 8B).

Therefore, according to the present embodiment, it is possible to form the pad portions $HU_1$ to $HU_4$ from the belt portion 5A, simply and accurately. For example, it is possible to form a wide space in the ±X directions from the belt portion 11A (5A), and therefore, it is easy to avoid a mistaken cut of the word lines $WL_1$ to $WL_4$ by the trench $T_A$. Further, it is possible to form the opening portions $S_{A1}$, $S_{A2}$ at the corner portions of the belt portion 11A (5A), and therefore, it is easy to avoid a mistaken cut of the word lines $WL_1$ to $WL_4$ by the trenches $T_{A1}$, $T_{A2}$.

Further, in the present embodiment, it is possible to form the belt portion 5A and the pad portions $HU_1$ to $HU_4$ in a nearly quadrangular shape. Therefore, according to the present embodiment, it is possible to set a wide area for the pad portions $HU_1$ to $HU_4$, and to enhance the integration degree of the semiconductor device.

Second Embodiment

Figure 12:
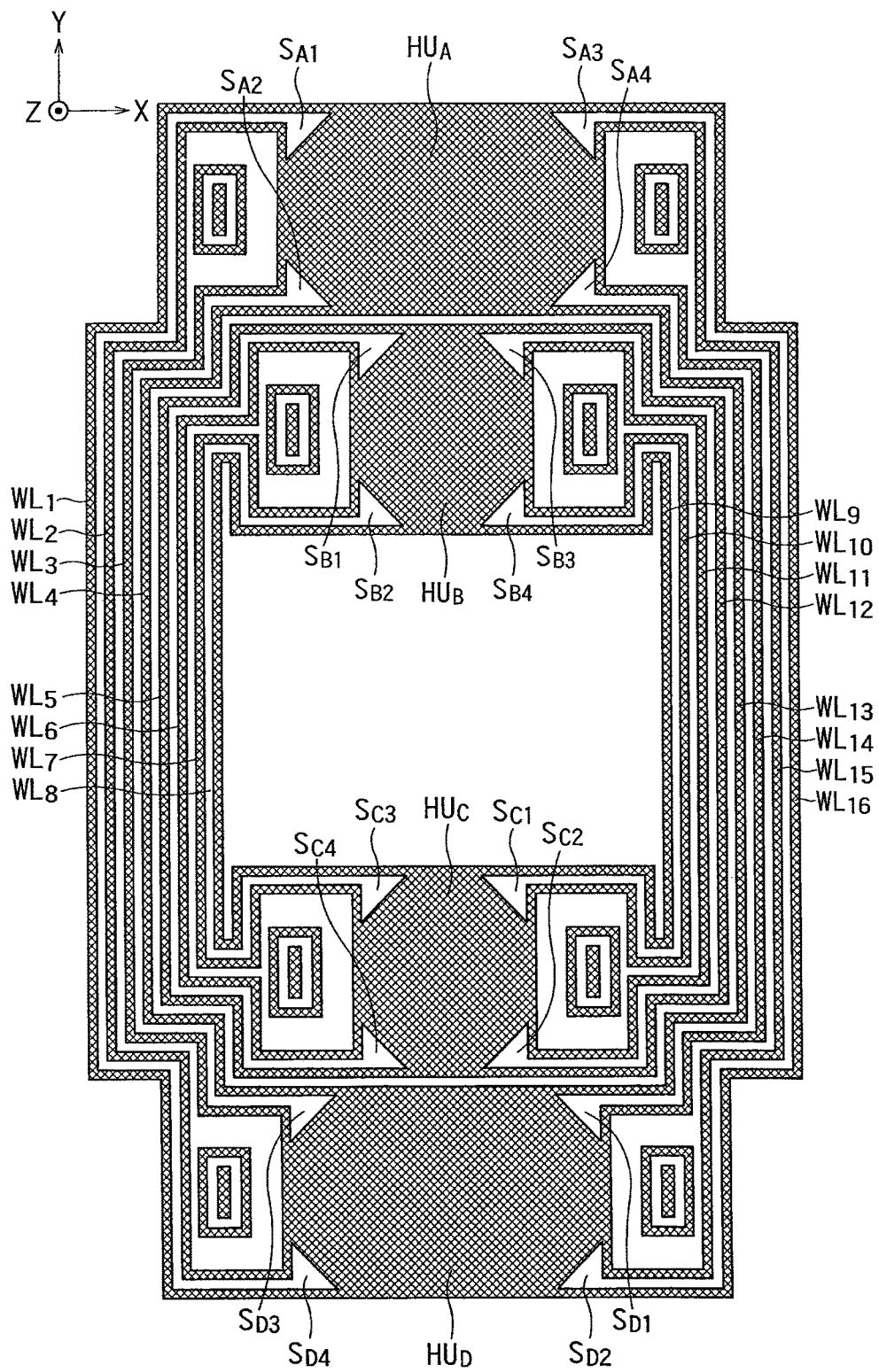
FIGS. 12 and 13 are plan views showing a method of manufacturing a semiconductor device of a second embodiment.
Figure 13:
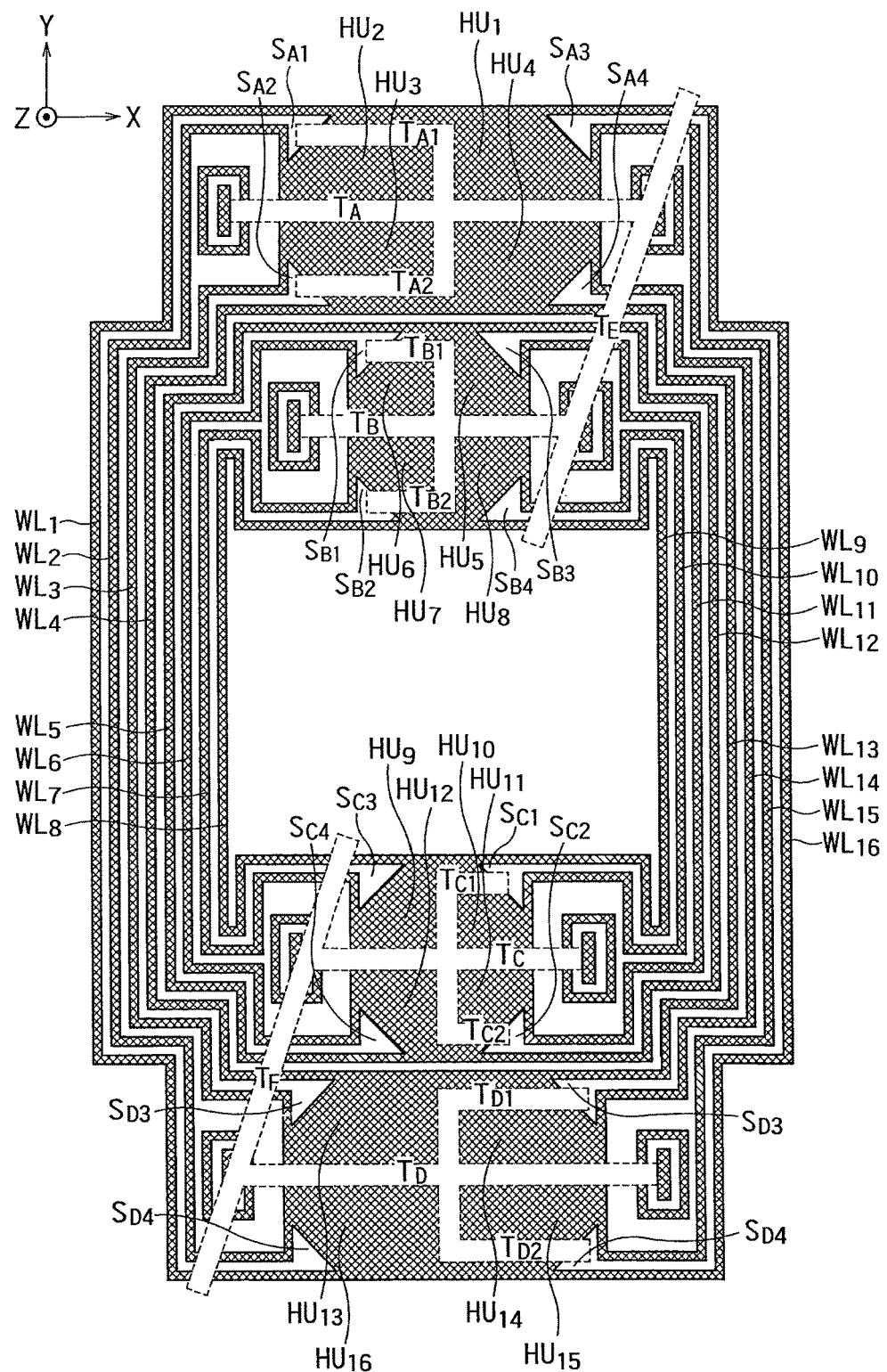

FIGS. 12 and 13 are plan views showing a method of manufacturing a semiconductor device of a second embodiment.

FIGS. 12 and 13 correspond to FIGS. 9 and 10 respectively, and show the shapes of the control gate material 5 before division and after division. Belt portions $HU_A$, $HU_B$ in FIG. 12 represent the belt portions 5A, 5B, respectively.

As shown in FIG. 12, the word lines $WL_1$ to $WL_4$ are connected with a belt portion $HU_D$, in addition to the belt portion $HU_A$. Further, the belt portions $HU_A$, $HU_D$ are connected with word lines $WL_{13}$ to $WL_{16}$, also. The word lines $WL_{13}$ to $WL_{16}$, which are examples of the fifth to eighth interconnects respectively, are arranged so as to be adjacent to each other. Similarly to the first embodiment, dummy portions are arranged in the ±X directions from the belt portions $HU_A$, $HU_D$.

Similarly, the word lines $WL_5$ to $WL_8$ are connected with a belt portion $HU_C$, in addition to the belt portion $HU_B$. Further, the belt portions $HU_B$, $HU_C$ are connected with word lines $WL_9$ to $WL_{12}$, also. The word lines $WL_9$ to $WL_{12}$, which are examples of the fifth to eighth interconnects respectively, are arranged so as to be adjacent to each other. Similarly to the first embodiment, dummy portions are arranged in the ±X directions from the belt portions $HU_B$, $HU_C$.

As shown in FIG. 13, the belt portion $HU_A$ is divided by the trenches $T_A$, $T_{A1}$, $T_{A2}$, and the belt portion $HU_B$ is divided by the trenches $T_B$, $T_{B1}$, $T_{B2}$. This is the same as the first embodiment. Further, the word lines $WL_9$ to $WL_{16}$ are cut by a trench $T_E$ that passes through the dummy portions in the +X directions from the belt portions $HU_A$, $HU_B$. As a result, the belt portions $HU_A$, $HU_B$ are separated (electrically insulated) from the word lines $WL_9$ to $WL_{16}$. Further, the belt portions $HU_A$, $HU_B$ are divided into pad portions $HU_1$ to $HU_8$ that are connected with the word lines $WL_1$ to $WL_8$, respectively.

Similarly, the belt portion $HU_C$ is divided by trenches $T_C$, $T_{C2}$, and the belt portion $HU_D$ is divided by trenches $T_D$, $T_{D1}$, $T_{D2}$. Further, the word lines $WL_1$ to $WL_8$ are cut by a trench $T_F$ that passes through the dummy portions in the −X directions from the belt portions $HU_C$, $HU_D$. As a result, the belt portions $HU_C$, $HU_D$ are separated (electrically insulated) from the word lines $WL_1$ to $WL_8$. Further, the belt portions $HU_C$, $HU_D$ are divided into pad portions $HU_9$ to $HU_{16}$ that are connected with the word lines $WL_9$ to $WL_{16}$, respectively.

The trenches $T_A$, $T_B$, $T_C$, $T_D$ may be formed by the cutting of the dummy portions as shown in the present embodiment, or may be formed without the cutting of the dummy portions as shown in the first embodiment.

Figure 14:
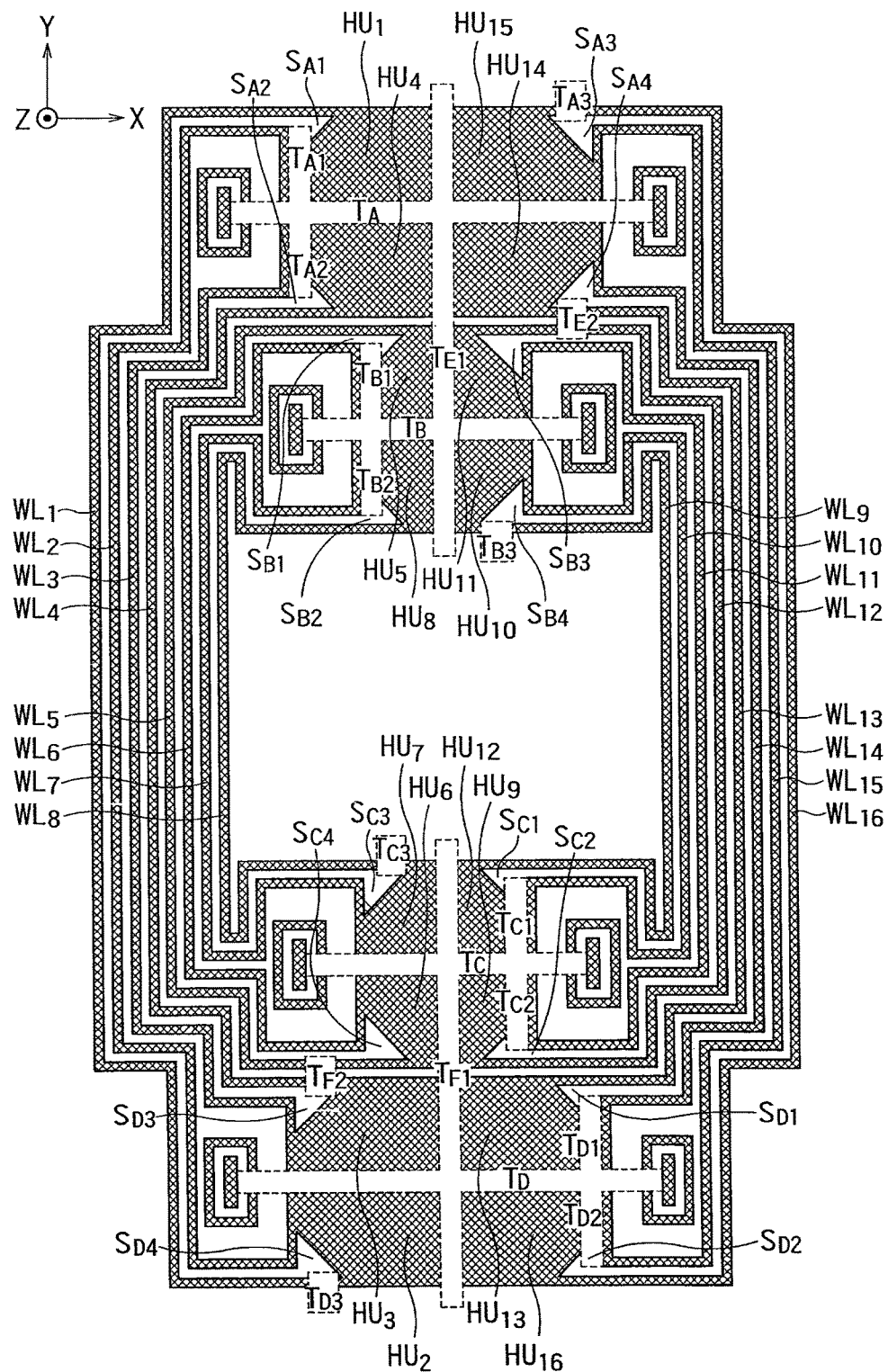
FIG. 14 is a plan view showing a method of manufacturing a semiconductor device of a modification of the second embodiment.

FIG. 14 is a plan view showing a method of manufacturing a semiconductor device of a modification of the second embodiment.

FIG. 14 corresponds to FIG. 10, similarly to FIG. 13, and shows the shape of the control gate material 5 after division.

In FIG. 14, the trenches $T_{A1}$, $T_{A2}$ extend in the Y direction so as to link the trench $T_A$ and the opening portions $S_{A1}$, $S_{A2}$, respectively, and the trenches $T_{B1}$, $T_{B2}$ extend in the Y direction so as to link the trench $T_B$ and the opening portions $S_{B1}$, $S_{B2}$, respectively. Further, a trench $T_{E1}$ extends in the Y direction such that the belt portions $HU_A$, $HU_B$ as well as the trenches $T_A$, $T_B$ are divided into four. Further, trenches $T_{A3}$, $T_{B3}$, $T_{E2}$ are formed at the opening portions $S_{A3}$, $S_{A4}$, $S_{B3}$, $S_{B4}$ such that the word lines $WL_9$, $WL_{12}$, $WL_{13}$, $WL_{16}$ are cut.

As a result, the belt portions $HU_A$, $HU_B$ are separated (electrically insulated) from the word lines $WL_2$, $WL_3$, $WL_6$, $WL_9$, $WL_{12}$, $WL_{13}$, $WL_{16}$. Further, the belt portions $HU_A$, $HU_B$ are divided into the pad portions $HU_1$, $HU_4$, $HU_5$, $HU_8$, $HU_{10}$, $HU_{11}$, $HU_{14}$, $HU_{15}$ that are connected with the word lines $WL_1$, $WL_4$, $WL_5$, $WL_8$, $WL_{10}$, $WL_{11}$, $WL_{14}$, $WL_{15}$, respectively.

Similarly, the belt portions $HU_C$, $HU_D$ are separated (electrically insulated) from the word lines $WL_1$, $WL_4$, $WL_5$, $WL_8$, $WL_{10}$, $WL_{14}$, $WL_{15}$. Further, the belt portions $HU_C$, $HU_D$ are divided into the pad portions $HU_2$, $HU_3$, $HU_6$, $HU_7$, $HU_9$, $HU_{12}$, $HU_{13}$, $HU_{16}$ that are connected with the word lines $WL_2$, $WL_3$, $WL_6$, $WL_7$, $WL_9$, $WL_{12}$, $WL_{13}$, $WL_{16}$, respectively.

According to the present embodiment, similarly to the first embodiment, it is possible to form the pad portions $HU_1$ to $HU_{16}$ from the belt portions $HU_A$ to $HU_D$, simply and accurately.

The shape of the trench for dividing the belt portions $HU_A$ to $HU_D$ may be other than the shapes shown in FIG. 13 and FIG. 14. However, as for the trenches in FIG. 13, for example, the trenches $T_E$, $T_F$ for cutting the belt portions $HU_A$ to $HU_D$ and the word lines $WL_1$ to $WL_{16}$ have a line shape, and therefore, there is an advantage that the trenches $T_E$, $T_F$ are easily formed. Further, for example, the trenches in FIG. 14 have an advantage that the areas of the pad portions $HU_1$ to $HU_{16}$ are easily widened.

Third Embodiment

FIGS. 15 to 20 are plan views showing a method of manufacturing a semiconductor device of a third embodiment. In the description of the present embodiment, detailed descriptions for common matters with the first embodiment are omitted.

First, the gate insulator 2, the floating gate material 3, the inter gate insulator 4, the control gate material 5, the first mask layer 11, the second mask layer 12, the hard mask layer 13, the first core material 14, the second core material 15, and the resist film 16 are formed in order, on the substrate 1, and the resist film 16 is processed by lithography (see FIG. 1B).

[FIG. 15]

Figure 15:
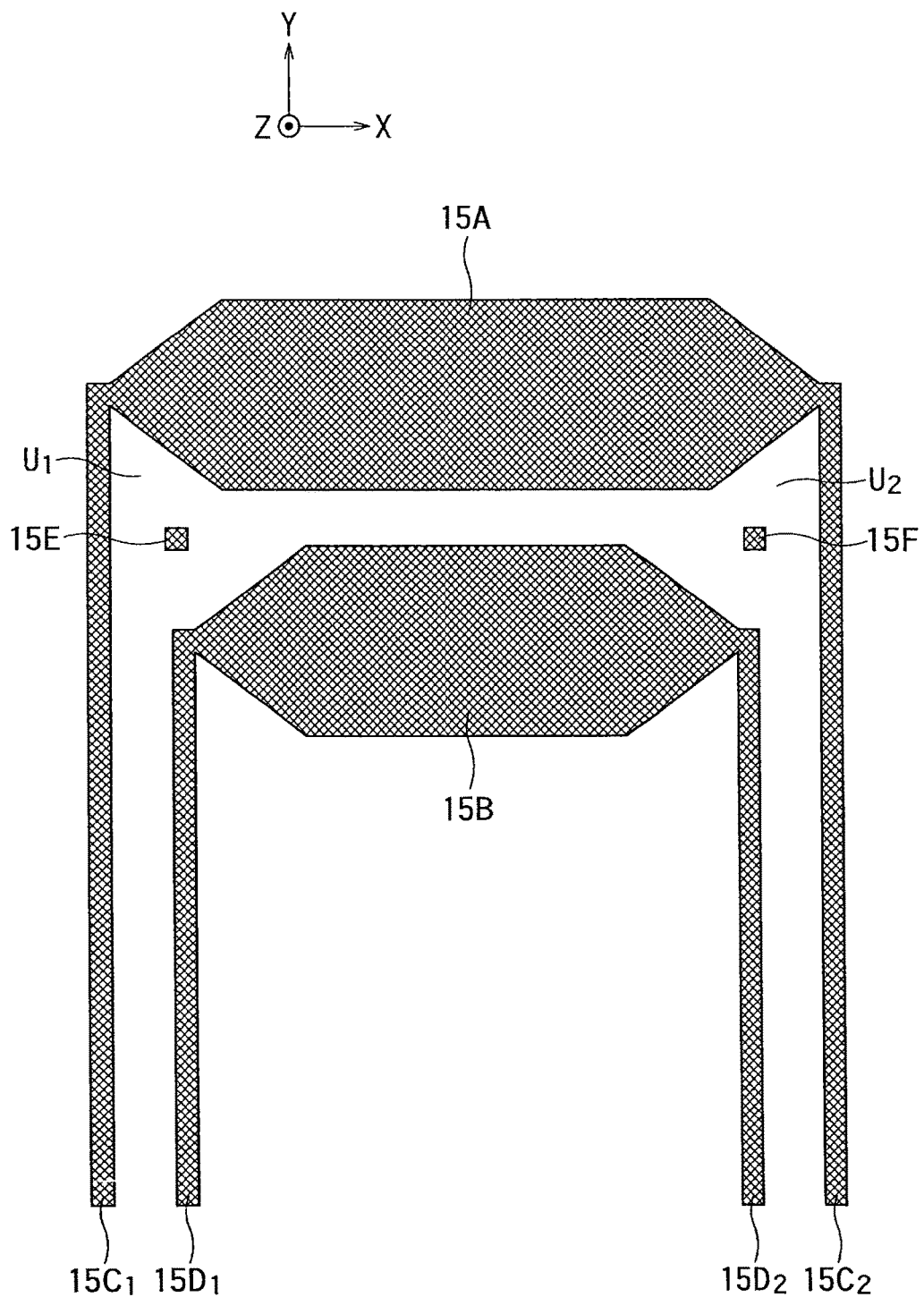
FIGS. 15 to 20 are plan views showing a method of manufacturing a semiconductor device of a third embodiment.

Next, by the etching using the resist film 16 as a mask, the second core material 15 is processed (FIG. 15). As a result, the second core material 15 is processed into a core material pattern including belt portions 15A, 15B, line portions $15C_1$, $15C_2$, $15D_1$, $15D_2$, and dummy portions 15E, 15F.

The belt portions 15A, 15B, which extend in the X direction, are examples of first and second belt portions, respectively. The line portions $15C_1$, $15D_1$ extend mainly in the Y direction, and are connected with the belt portions 15A, 15B, respectively. The line portions $15C_1$, $15D_1$ are examples of the first and second line portions, respectively. The line portions $15C_2$, $15D_2$ extend mainly in the Y direction, and are connected with the belt portions 15A, 15B, respectively. The line portions $15C_2$, $15D_2$ are examples of the first and second line portions, respectively.

The dummy portion 15E is separated from the belt portions 15A, 15B and the line portions $15C_1$, $15D_1$, and has a line shape. In the present embodiment, there is a wide space $U_1$ between the belt portion 15A and line portion $15C_1$ and the belt portion 15B and line portion $15D_1$, and the dummy portion 15E is arranged in the space $U_1$.

The dummy portion 15F is separated from the belt portions 15A, 15B and the line portions $15C_2$, $15D_2$, and has a line shape. In the present embodiment, there is a wide space $U_2$ between the belt portion 15A and line portion $15C_2$ and the belt portion 15B and line portion $15D_2$, and the dummy portion 15F is arranged in the space $U_2$.

[FIG. 16]

Figure 16:
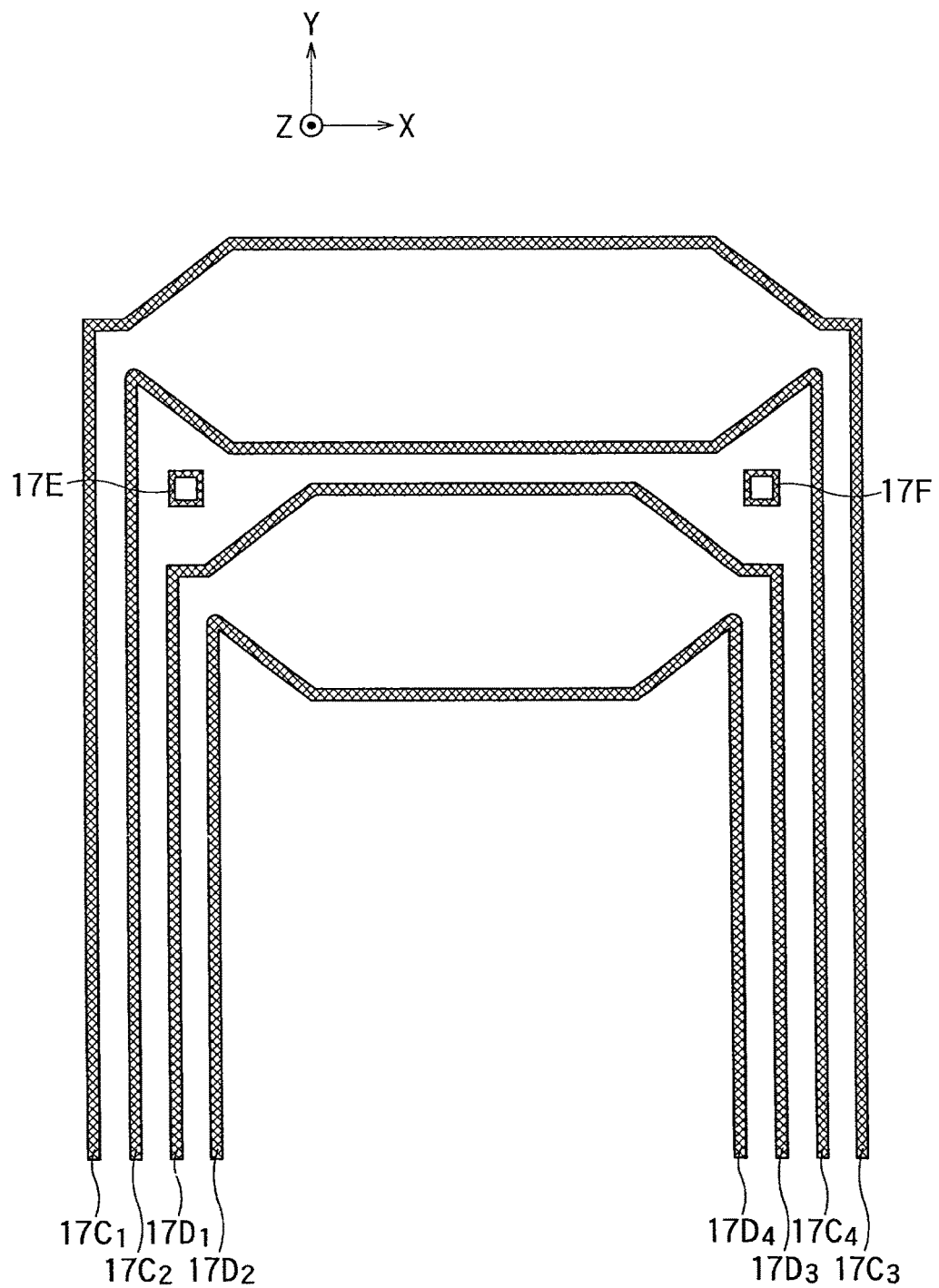

Next, a first sidewall film 17 is formed on the side faces of the second core material 15, and the second core material 15 is removed by etching or ashing (FIG. 16).

The first sidewall film 17 includes line portions $17C_1$ to $17C_4$ formed on the side faces of the belt portion 15A and line portions $15C_1$, $15C_2$ of the second core material 15, and line portions $17D_1$ to $17D_4$ formed on the side faces of the belt portion 15B and line portions $15D_1$, $15D_2$ of the second core material 15.

The first sidewall film 17 further includes a dummy portion 17E formed on the side faces of the dummy portion 15E, and a dummy portion 17F formed on the side faces of the dummy portion 15F. The dummy portions 17E, 17F have a ring shape.

The line portions $17C_1$, $17C_2$ are connected with the line portions $17C_3$, $17C_4$, respectively, at the region where the belt portion 15A was present. Further, the line portions $17D_1$, $17D_2$ are connected with the line portions $17D_3$, $17D_4$, respectively, at the region where the belt portion 15B was present.

[FIG. 17]

Figure 17:
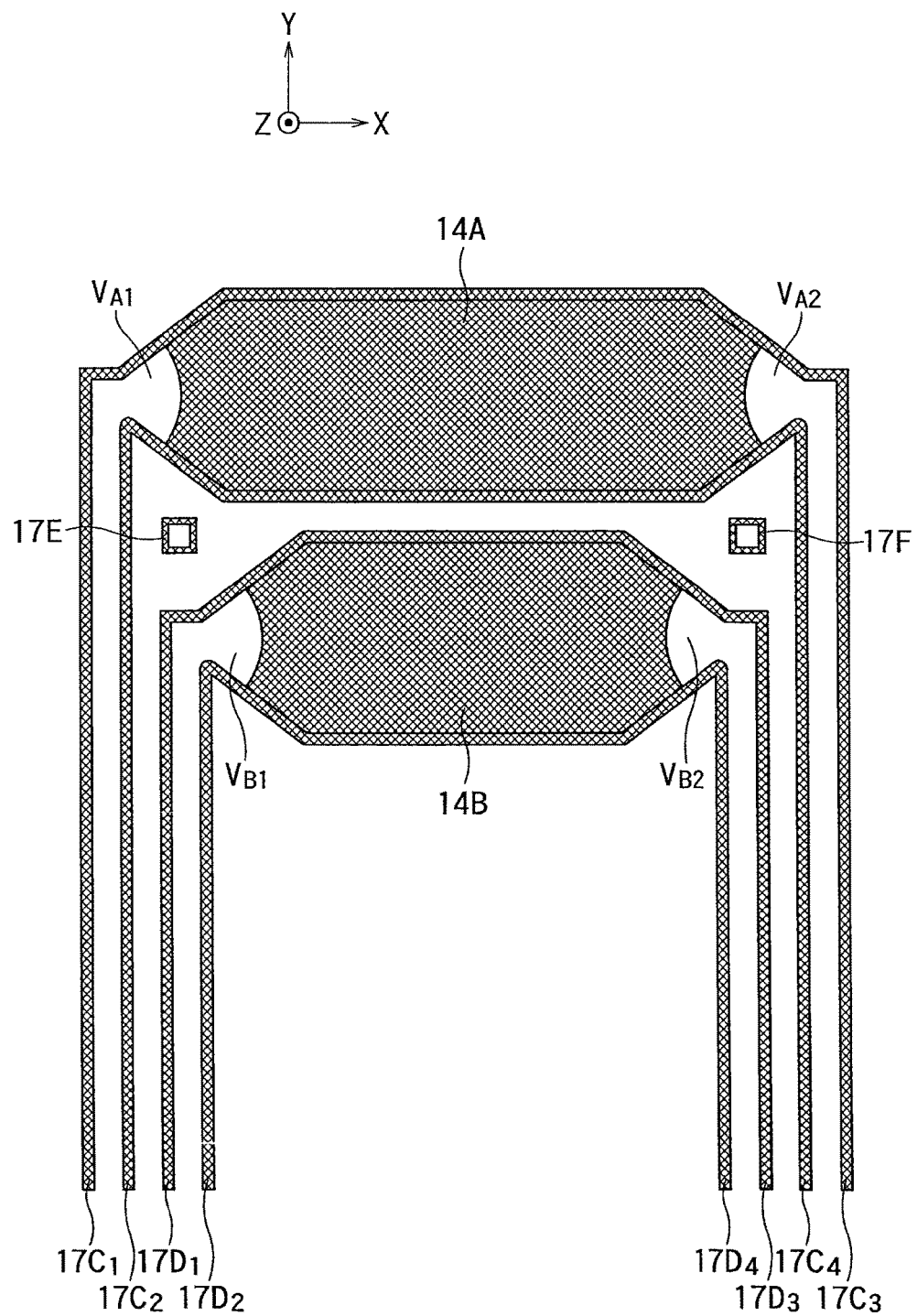

Next, by the etching using the first sidewall film 17 as a mask, the first core material 14 is processed (FIG. 17). As a result, the first core material 14 is processed into a core material pattern including belt portions 14A, 14B, line portions $14C_1$ to $14C_4$, $14D_1$ to $14D_4$, and dummy portions 14E, 14F. The line portions $14C_1$ to $14C_4$, $14D_1$ to $14D_4$, and the dummy portions 14E, 14F, for which the illustration is omitted for the convenience of the figure drawing, are positioned under the line portions $17C_1$ to $17C_4$, $17D_1$ to $17D_4$ and the dummy portions 17E, 17F.

The line portions $17C_1$ to $17C_4$, $17D_1$ to $17D_4$ and dummy portions 17E, 17F of the first sidewall film 17 are transferred to the first core material 14, and thereby, the line portions $14C_1$ to $14C_4$, $14D_1$ to $14D_4$ and dummy portions 14E, 14F in the present embodiment are formed.

On the other hand, the belt portions 14A, 14B in the present embodiment are formed by the reverse loading effect. However, the belt portion 14A is formed such that opening portions $V_{A1}$, $V_{A2}$ remain at end portions of the belt portion 14A. Further, the belt portion 14B is formed such that opening portions $V_{B1}$, $V_{B2}$ remain at end portions of the belt portion 14B. The reason is because the spaces at the end portions of the belt portions 14A, 14B are gradually widened, and therefore, the spaces near the end portions of the belt portions 14A, 14B are narrow.

[FIG. 18]

Figure 18:
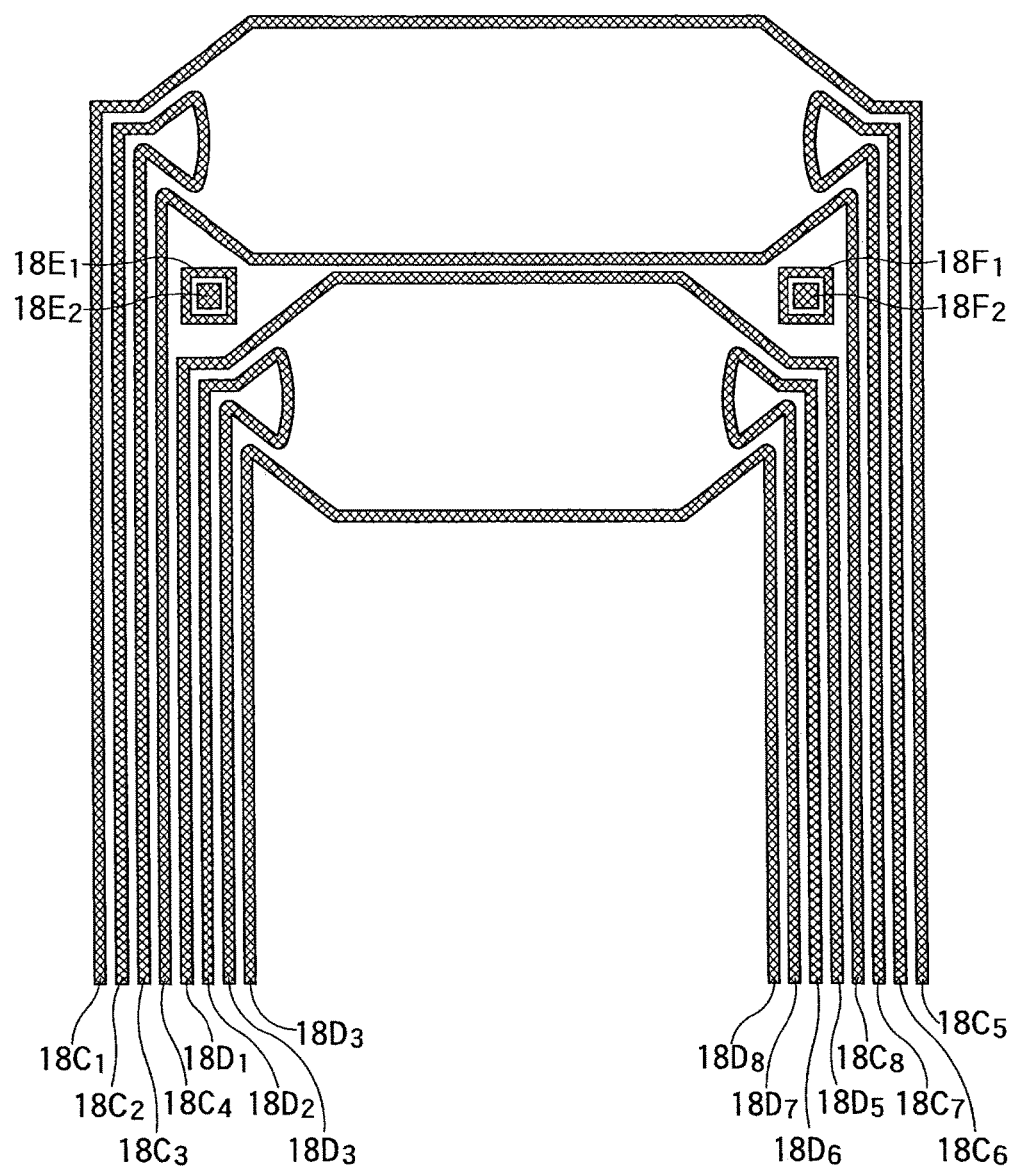

Next, a second sidewall film 18 is formed on the side faces of the first core material 14, and the first core material 14 is removed by etching or ashing (FIG. 18).

The second sidewall film 18 includes line portions $18C_1$ to $18C_8$ formed on the side faces of the belt portion 14A and line portions $14C_1$ to $14C_4$ of the first core material 14, and line portions $18D_1$ to $18D_8$ formed on the side faces of the belt portion 14B and line portions $14D_1$ to $14D_4$ of the first core material 14.

The second sidewall film 18 further includes dummy portions $18E_1$, $18E_2$ formed on the side faces of the dummy portion 14E, and dummy portions $18F_1$, $18F_2$ formed on the side faces of the dummy portion 14F. The dummy portions $18E_1$, $18F_1$ have a ring shape, and the dummy portions $18E_2$, $18F_2$ have a line shape.

The line portions $18C_1$ to $18C_4$ are connected with the line portions $18C_5$ to $18C_8$, respectively, at the region where the belt portion 14A was present. Further, the line portions $18D_1$ to $18D_4$ are connected with the line portions $18D_5$ to $18D_8$, respectively, at the region where the belt portion 14B was present.

[FIG. 19]

Figure 19:
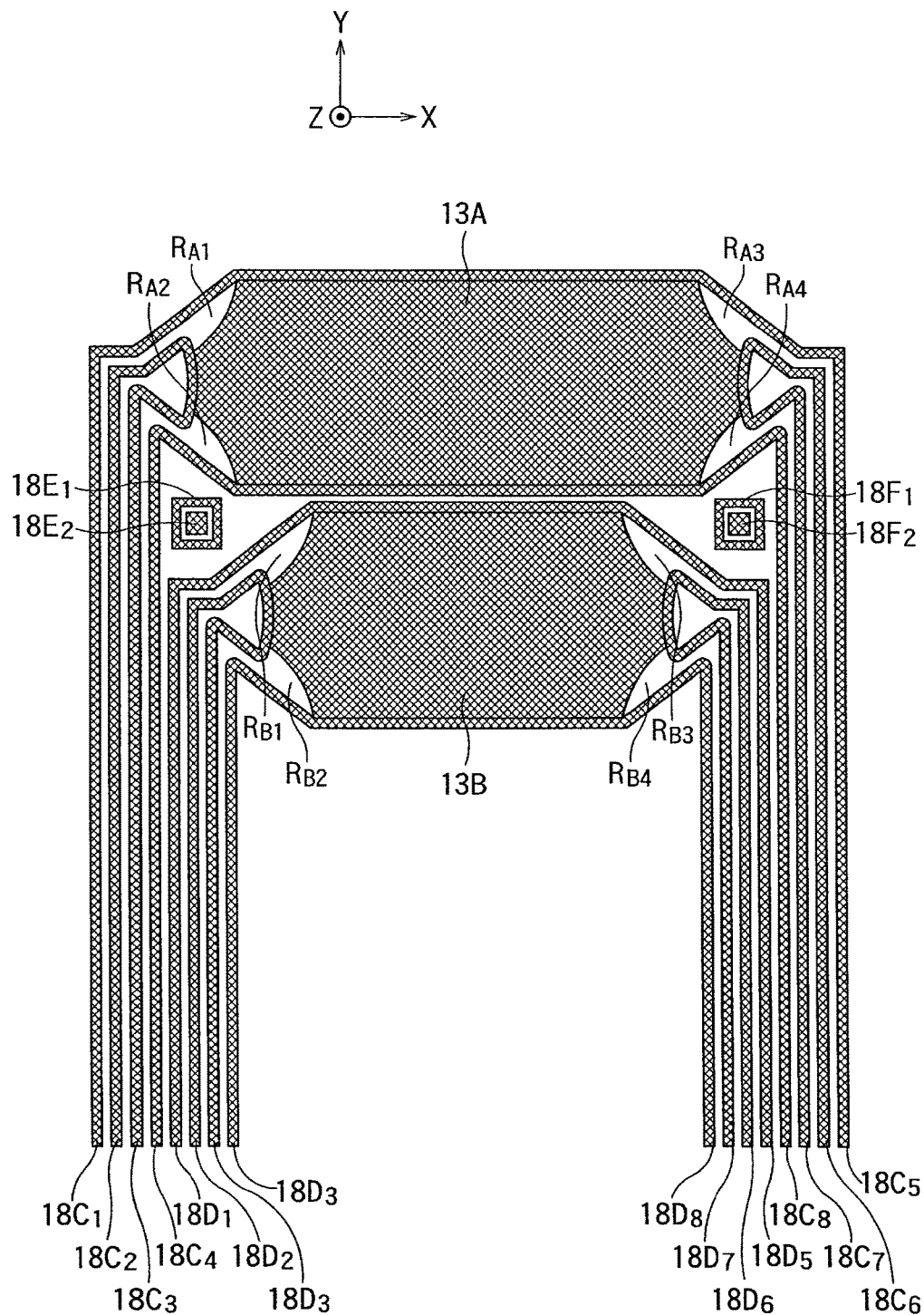

Next, by the etching using the second sidewall film 18 as a mask, the hard mask layer 13 is processed (FIG. 19). As a result, the hard mask layer 13 is processed into a hard mask pattern including belt portions 13A, 13B, line portions $13C_1$ to $13C_8$, $13D_1$ to $13D_8$, and dummy portions $13E_1$, $13E_2$, $13F_1$, $13F_2$. The line portions $13C_1$ to $13C_8$, $13D_1$ to $13D_8$ and the dummy portions $13E_1$, $13E_2$, $13F_1$, $13F_2$, for which the illustration is omitted for the convenience of the figure drawing, are positioned under the line portions $18C_1$ to $18C_8$, $18D_1$ to $18D_8$ and the dummy portions $18E_1$, $18E_2$, $18F_1$, $18F_2$, respectively.

The line portions $18C_1$ to $18C_8$, $18D_1$ to $18D_8$ and dummy portions $18E_1$, $18E_2$, $18F_1$, $18F_2$ of the second sidewall film 18 are transferred to the hard mask layer 13, and thereby, the line portions $13C_1$ to $13C_8$, $13D_1$ to $13D_8$ and dummy portions $13E_1$, $13E_2$, $13F_1$, $13F_2$ in the present embodiment are formed.

On the other hand, the belt portions 13A, 13B in the present embodiment are formed by the reverse loading effect. However, the belt portion 13A is formed such that opening portions $R_{A1}$ to $R_{A4}$ remain at corner portions of the belt portion 13A. Further, the belt portion 13B is formed such that opening portions $R_{B1}$ to $R_{B4}$ remain at corner portions of the belt portion 13B. The reason is that the distance between the line portions $18C_1$, $18C_2$, the distance between the line portions $18D_1$, $18D_2$, and the like are short near the corner portions.

[FIG. 20]

Figure 20:
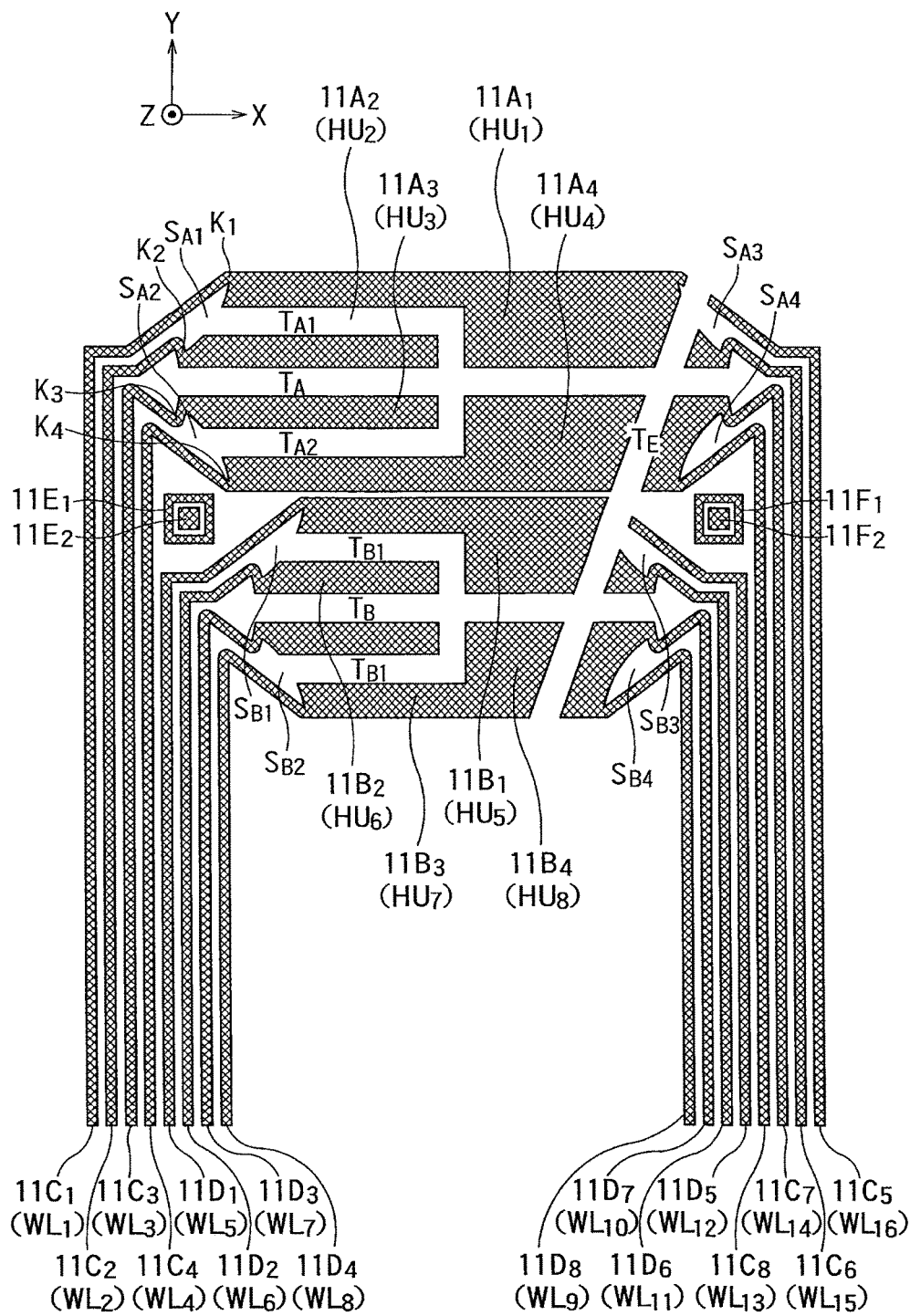

Next, the second mask layer 12, the first mask layer 11, the control gate material 5, the inter gate insulator 4, the floating gate material 3 and the gate insulator 2 are processed by the etching using the hard mask layer 13 as a mask, and their belt portions are divided by lithography or etching (FIG. 20). As a result, the first mask layer 11 is processed into a mask pattern including belt portions $11A_1$ to $11A_4$, $11B_1$ to $11B_4$, line portions $11C_1$ to $11C_8$, $11D_1$ to $11D_8$, and dummy portions $11E_1$, $11E_2$, $11F_1$, $11F_2$.

The same goes for the control gate material 5, the inter gate insulator 4, the floating gate material 3, and the gate insulator 2. For example, the control gate material 5 is processed into an interconnect pattern including belt portions $5A_1$ to $5A_4$, $5B_1$ to $5B_4$, line portions $5C_1$ to $5C_8$, $5D_1$ to $5D_8$, and dummy portions $5E_1$, $5E_2$, $5F_1$, $5F_2$.

The belt portions $5A_1$ to $5A_4$, $5B_1$ to $5B_4$, the line portions $5C_1$ to $5C_8$, $5D_1$ to $5D_8$, and the dummy portions $5E_1$, $5E_2$, $5F_1$, $5F_2$, for which the illustration is omitted for the convenience of the figure drawing, are positioned under the belt portions $11A_1$ to $11A_4$, $11B_1$ to $11B_4$, the line portions $11C_1$ to $11C_8$, $11D_1$ to $11D_8$, and the dummy portions $11E_1$, $11E_2$, $11F_1$, $11F_2$, respectively. The line portions $5C_1$ to $5C_4$, $5D_1$ to $5D_4$, $5D_8$ to $5D_5$, $5C_8$ to $5C_5$ function as word lines $WL_1$ to $WL_{16}$, respectively. Further, the belt portions $5A_1$ to $5A_4$, $5B_1$ to $5B_4$ function as pad portions $HU_1$ to $HU_B$ for the word lines $WL_1$ to $WL_8$, respectively. The word lines $WL_1$ to $WL_8$ are examples of the first to eighth interconnects, respectively, and the dummy portions $5E_1$, $5E_2$ are examples of the one or more interconnects. Further, the belt portions $5A_1$ to $5A_4$ and belt portions $5B_1$ to $5B_4$ before division are examples of the first and second belt portions, respectively.

The belt portions $11A_1$ to $11A_4$ are connected with the line portions $11C_1$ to $11C_4$, respectively, and the belt portions $11B_1$ to $11B_4$ are connected with the line portions $11D_1$ to $11D_4$, respectively. The line portions $11C_1$ to $11C_4$, $11D_1$ to $11D_4$ extend mainly in the Y direction, and are arranged so as to be adjacent to each other. The line portions $11C_5$ to $11C_8$, $11D_5$ to $11D_8$ extend mainly in the Y direction, and are arranged so as to be adjacent to each other. The same goes for the belt portions $5A_1$ to $5A_4$, $5B_1$ to $5B_4$ and the line portions $5C_1$ to $5C_8$, $5D_1$ to $5D_8$.

The dummy portions $11E_1$, $11E_2$ are separated from the belt portions $11A_1$ to $11A_4$, $11B_1$ to $11B_4$ and the line portions $11C_1$ to $11C_4$, $11D_1$ to $11D_4$ and are positioned between the line portions $11C_1$ to $11C_4$ and the line portions $11D_1$ to $11D_4$. The dummy portion $11E_1$ has a ring shape, and the dummy portion $11E_2$ has a line shape. The same goes for the line portions $5C_1$ to $5C_4$, $5D_1$ to $5D_4$ and the dummy portions $5E_1$, $5E_2$. The dummy portions $5E_1$, $5E_2$ are separated (electrically insulated) from the belt portions $5A_1$ to $5A_4$, $5B_1$ to $5B_4$ and the line portions $5C_1$ to $5C_4$, $5D_1$ to $5D_4$.

The dummy portions $11F_1$, $11F_2$ are separated from the belt portions $11A_1$ to $11A_4$, $11B_1$ to $11B_4$ and the line portions $11C_5$ to $11C_8$, $11D_5$ to $11D_8$, and are positioned between the line portions $11C_5$ to $11C_8$ and the line portions $11D_5$ to $11D_8$. The dummy portion $11F_1$ has a ring shape, and the dummy portion $11F_2$ has a line shape. The same goes for the line portions $5C_5$ to $5C_8$, $5D_5$ to $5D_8$ and the dummy portions $5F_1$, $5F_2$. The dummy portions $5F_1$, $5F_2$ are separated (electrically insulated) from the belt portions $5A_1$ to $5A_4$, $5B_1$ to $5B_4$ and the line portions $5C_5$ to $5C_8$, $5D_5$ to $5D_8$.

Thereafter, in the present embodiment, an inter layer dielectric is formed on the whole surface of the substrate 1, contact holes that penetrate the inter layer dielectric and reach the pad portions $HU_1$ to $HU_8$ are formed, and contact plugs 21 are formed on the pad portions $HU_1$ to $HU_8$ in the contact holes. Furthermore, various interconnect layers, plug layers, inter layer dielectrics and the like are formed on the substrate 1. In this way, the semiconductor device of the present embodiment is manufactured.

In the present embodiment, as shown in FIG. 15, the wide space $U_1$ is present between the belt portion 15A and line portion $15C_1$ and the belt portion 15B and line portion $15D_1$. Furthermore, the wide space $U_2$ is present between the belt portion 15A and line portion $15C_2$ and the belt portion 15B and line portion $15D_2$. Therefore, when the pattern of the first sidewall film 17 is transferred to the first core material 14, there is a possibility that the first core material 14 remains under the spaces $U_1$, $U_2$ by the reverse loading effect.

Therefore, in the present embodiment, as shown in FIG. 15, the dummy portions 15E, 15F are arranged in the spaces $U_1$, $U_2$. Therefore, according to the present embodiment, it is possible to inhibit the first core material 14 from remaining under the spaces $U_1$, $U_2$ due to the reverse loading effect (FIG. 17). The same goes for the hard mask layer 13, the first mask layer 11, the control gate material 5 and the like (FIGS. 19 and 20). Therefore, according to the present embodiment, it is possible to prevent the short-circuit of the word lines $WL_1$ to $WL_8$ and the pad portions $HU_1$ to $HU_8$.

In the present embodiment, for preventing the above-described reverse loading effect, the distances between the dummy portions 15E, 15F and the other portion of the second core material 15 is set to "Wa" or less. The same goes for the dummy portions in the other layers.

As described so far, according to the present embodiment, it is possible to accurately form the pad portions $HU_1$ to $HU_8$, by the simple method in which the dummy portions 15E, 15F are arranged in the spaces $U_1$, $U_2$.

The structure and method of the present embodiment may be used in combination with the structure and method of the first embodiment or the second embodiment.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   first to fourth interconnects provided on the substrate so as to be adjacent to one another;
   a first pad portion connected with the first or second interconnect;
   a second pad portion adjacent to the first pad portion in a first direction and in a second direction perpendicular to the first direction;
   a third pad portion connected with the third or fourth interconnect, and adjacent to one of the first and second pad portions in the second direction;
   a fourth pad portion adjacent to the third pad portion in the first direction and in the second direction, and adjacent to the other of the first and second pad portions in the second direction; and
   one or more interconnects electrically insulated from the first to fourth interconnects and the first to fourth pad portions, and provided between the first and second interconnects and the third and fourth interconnects,
   wherein
   a width of the first pad portion in the second direction is larger than a width of the second pad portion in the second direction,
   a width of the fourth pad portion in the second direction is larger than a width of the third pad portion in the second direction,
   a distance between an end portion of the first interconnect and an end portion of the second interconnect in the first direction, and a distance between the end portion of the first interconnect and the end portion of the second interconnect in the second direction are greater than a space width between the first interconnect and the second interconnect, and
   a distance between an end portion of the third interconnect and an end portion of the fourth interconnect in the first direction, and a distance between the end portion of the third interconnect and the end portion of the fourth interconnect in the second direction are greater than a space width between the third interconnect and the fourth interconnect.

2. The device of claim 1, wherein the one or more interconnects include an interconnect having a ring shape.

3. The device of claim 1, wherein
the first and second pad portions are respectively connected with the first and second interconnects, and
the third and fourth pad portions are respectively connected with the third and fourth interconnects.

4. The device of claim 1, wherein
the first pad portion is located on a first side of the first direction in regard to the second pad portion,
the fourth pad portion is located on the first side of the first direction in regard to the third pad portion, and
end portions of the first to fourth interconnects are located on a second side of the first direction in regard to the first to fourth pad portions, respectively.

5. The device of claim 1, wherein
the first pad portion is located on a first side of the first direction in regard to the second pad portion, the fourth pad portion is located on the first side of the first direction in regard to the third pad portion, and the one or more interconnects are located on a second side of the first direction in regard to the second and third pad portions.

6. The device of claim 1, further comprising first to fourth contact plugs provided on the first to fourth pad portions, respectively.

7. The device of claim 1, wherein
the first and second pad portions are divided by a first trench that extends in the first and second directions between the first and second pad portions, and
the third and fourth pad portions are divided by a second trench that extends in the first and second directions between the first and second pad portions.

8. The device of claim 1, wherein
each of the first to fourth interconnects comprises a plurality of straight line portions and a plurality of bent portions, each of which is provided between two of the straight line portions,
the longest straight line portion in the first interconnect, the longest straight line portion in the second interconnect, the longest straight line portion in the third interconnect, and the longest straight line portion in the fourth interconnect extend in the second direction, and
the lengths of sections of the first to fourth interconnects are different as they extend in the two directions.

9. The device of claim 1, wherein
the first pad portion is located on a first side of the first direction in regard to the second pad portion,
the fourth pad portion is located on the first side of the first direction in regard to the third pad portion, and
the one or more interconnects are located on a second side of the first direction in regard to the first to fourth pad portions.

* * * * *